(12) United States Patent
Kamei et al.

(10) Patent No.: US 6,274,516 B1
(45) Date of Patent: Aug. 14, 2001

(54) PROCESS FOR MANUFACTURING INTERLAYER INSULATING FILM AND DISPLAY APPARATUS USING THIS FILM AND ITS MANUFACTURING METHOD

(75) Inventors: Seiji Kamei; Katsumi Kurematsu, both of Hiratsuka; Osamu Koyama, Hachioji, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/179,085

(22) Filed: Oct. 27, 1998

(30) Foreign Application Priority Data

Oct. 27, 1997 (JP) .................................... 9-294461
Oct. 27, 1997 (JP) .................................... 9-294466

(51) Int. Cl.[7] .................................................. H01L 21/31
(52) U.S. Cl. .......................................... 438/782; 438/769
(58) Field of Search ................................ 438/782, 769, 438/787, 788, 761, 781, 783; 427/240

(56) References Cited

U.S. PATENT DOCUMENTS

| | | | |
|---|---|---|---|
| 4,981,340 | 1/1991 | Kurematsu et al. ................. | 350/333 |
| 5,251,050 | 10/1993 | Kawai et al. ........................... | 359/57 |
| 5,320,983 | * 6/1994 | Ouellet .................................. | 438/782 |
| 5,706,021 | 1/1998 | Kurematsu ............................ | 345/89 |
| 5,721,601 | * 2/1998 | Yamaji et al. ........................ | 349/138 |
| 5,816,677 | 10/1998 | Kuremtsu et al. .................... | 362/31 |
| 5,976,626 | * 11/1999 | Matsubara et al. .................. | 438/769 |
| 5,989,983 | * 11/1999 | Goo et al. ............................. | 438/473 |
| 6,054,181 | * 4/2000 | Nanbu et al. ......................... | 427/240 |

* cited by examiner

Primary Examiner—David Nelms
Assistant Examiner—Dung A Le
(74) Attorney, Agent, or Firm—Fitzpatrick, Cella, Harper & Scinto

(57) ABSTRACT

In a process for forming an interlayer insulating film using an SOG film, a process for manufacturing an interlayer insulating film comprising the steps of irradiating a first inorganic SOG film with ultraviolet light in an atmosphere containing oxygen components to generate ozone and active oxygen atoms in order to irradiate the SOG film with the atoms, and further forming a second inorganic SOG film thereon.

20 Claims, 27 Drawing Sheets

CONCAVE QUANTITY CHANGE ON CNT
BURYING CHANGE ACCORDING TO SOG THICKNESS

CONCAVE QUANTITY CHANGE ACCORDING TO WIRING INTERVAL
CONCAVE QUANTITY CHANGE BETWEEN WIRING ACCORDING TO SOG THICKNESS

CONCAVE QUANTITY CHANGE ON CNT USING W COAT

CONCAVE QUANTITY CHANGE ACCORDING TO WIRING INTERVAL USING W COAT

CONCAVE QUANTITY AT WHOLE PATTERN STEP

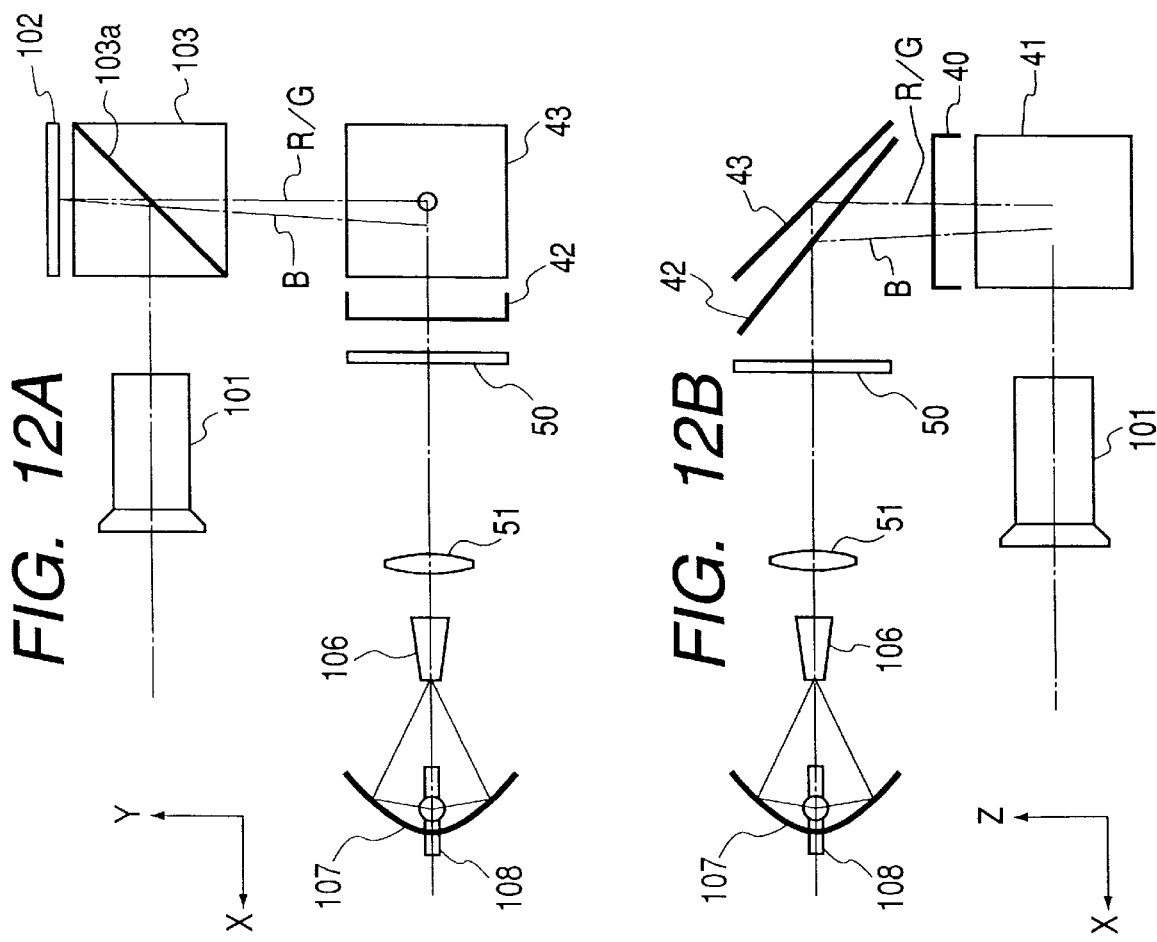

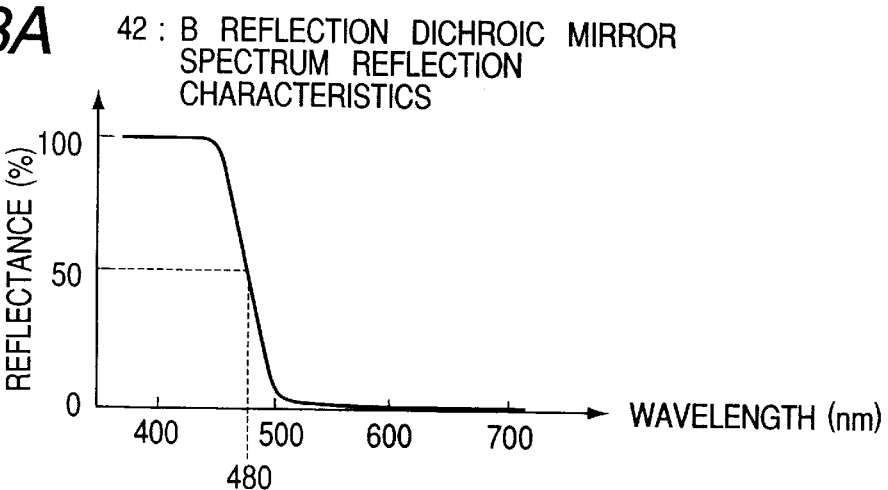
FIG. 13A  42 : B REFLECTION DICHROIC MIRROR SPECTRUM REFLECTION CHARACTERISTICS
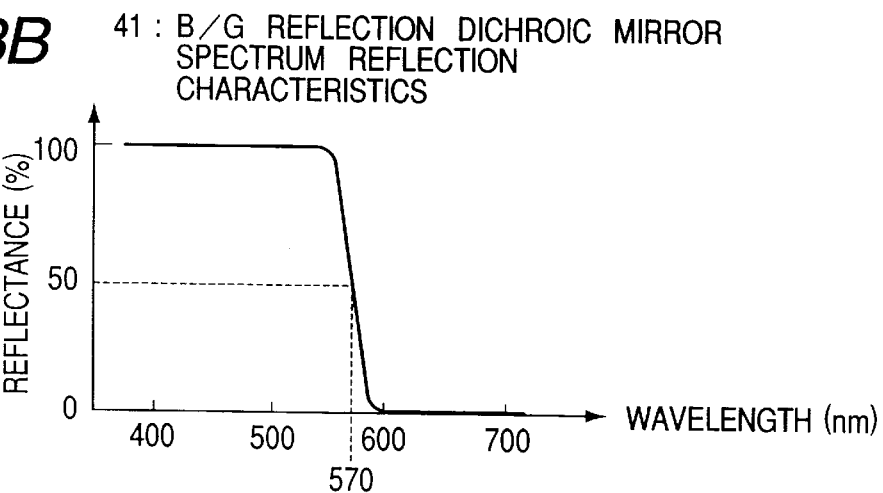
FIG. 13B  41 : B/G REFLECTION DICHROIC MIRROR SPECTRUM REFLECTION CHARACTERISTICS
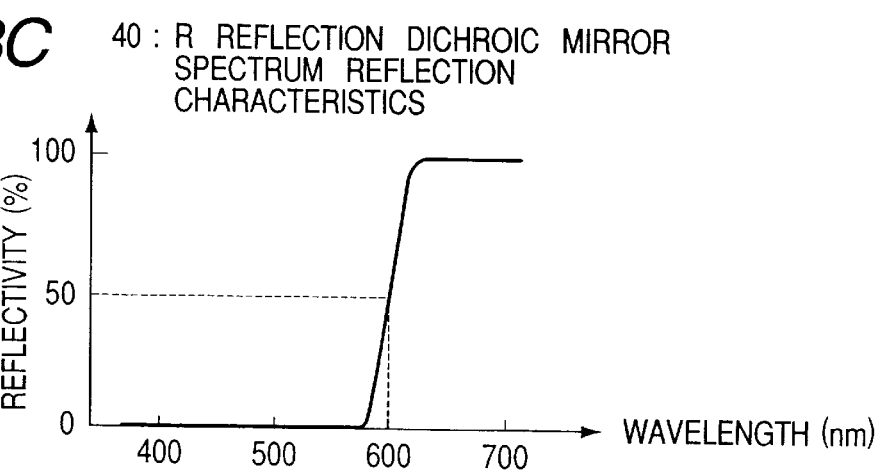
FIG. 13C  40 : R REFLECTION DICHROIC MIRROR SPECTRUM REFLECTION CHARACTERISTICS

RGB MIXED ARBITRARY COLOR

PROCESS FOR MANUFACTURING INTERLAYER INSULATING FILM AND DISPLAY APPARATUS USING THIS FILM AND ITS MANUFACTURING METHOD

BACKGROUND OF THE INVENTION

1. Field of the Invention

The present invention relates to a process for manufacturing an interlayer insulating film, and a display apparatus using this film and its manufacturing method.

2. Related Background Art

An SOG (Spin On Glass) film is conventionally generally used to flatten an interlayer insulating film, and this method is very effective in reducing the difference in the level of patterns (improving step coverage).

FIG. 10 is a sectional view of an interlayer insulating film in a semiconductor apparatus using the conventional technique.

In this figure, 1 is a semiconductor substrate, 2 is an insulating oxide film, 3 is a polycrystal silicon, 4 is an insulating film, 5 is a metal wiring, 6 is a first interlayer insulating film, 7 is an SOG film, 10 is a second interlayer insulating film, and 11 is a step inside a contact hole.

A conventional method is described below with reference to FIG. 10.

The insulating oxide film 2 is formed on the semiconductor substrate 1 using the selective oxidation process. Then, the polycrystal silicon 3 is deposited using the LP-CVD process, and the substrate is subjected to impurity-doping heat treatment and patterned using a photolithography step. In this manner, a semiconductor element is formed on the semiconductor substrate 1. The insulating film 4 is subsequently formed.

Then, patterning is executed to form a contact hole in the insulating film 4 for electric connections to the polycrystal silicon 3, a metal film is deposited thereon using the sputtering process, and the metal wiring 5 is formed thereon by patterning. Then, the P-CVD process is used to deposit the first interlayer insulating film 6. Then, the SOG film 7 is coated using the rotational coating process and is thermally treated. The etch back process is used to remove the flat part of the SOG film except for the periphery of the hole. Subsequently, the second interlayer insulating film 10 is deposited. After the interlayer insulating film of a multilayer structure is configured in this manner, a second metal wiring is formed.

The SOG film used to improve the flatness of the interlayer insulating film in the conventional example, however, often contains phosphorus to provide fluidity around the hole in the pattern. Thus, when the second metal wiring is formed in the subsequent process, the metal wirings may be corroded if the SOG is present around a hole called a "through-hole" that enables conduction between the first and second metal wirings. Consequently, the etching back process is required to remove the SOG only from this periphery. In addition, if an attempt is made to coat the SOG thick to reduce a step in a concave, the stress of the SOG may serve to produce a void to significantly degrade the electric characteristics of the element.

An organic SOG can be coated thick, but the $CH_3$ radical of the organic SOG is transformed into a polymer during the formation of a through-hole to cause inappropriate conduction or to produce a void. Thus, the etch back process is also required in this case, and the interlayer insulating film may not be flattened.

Furthermore, in the interlayer insulating film formation process according to this conventional example, the SOG film is present only around the step, so a step occurs inside the contact hole (11 in FIG. 10) and a step in a concave can be reduced only in part of the surface of the interlayer insulating film, thereby preventing flattening. As a result, during the subsequent formation of a multilayer metal wiring, an open circuit may occur in the metal wiring due to the effect of a step in a concave inside the contact hole 11, thereby substantially reducing the reliability and yield of a display apparatus or a semiconductor device.

In addition, the flatness of the conventional interlayer insulating film in a semiconductor element used for a liquid crystal display apparatus is relatively insufficient.

FIG. 11 shows a sectional structure of an interlayer insulating film in such an example.

In this figure, 1 is a semiconductor substrate, 2 is a LOCOS insulating film, 3 is a gate electrode, 4 is a BPSG film, 5 is a metal electrode wiring, 6 is a first interlayer insulating film, 7 is an SOG, 8 is a second interlayer insulating film, 9 is a concave, 10 is a step.

According to a conventional general process for MOS transistors, a well region is formed in the semiconductor substrate 1, and an SiN film is deposited. Part of the SiN film is removed by patterning, and the LOCOS insulating film 2 is formed using the thermal oxidation process. Then, a gate oxide film and a thermally oxidized film are formed using the thermal oxidation process, and Poly-Si is deposited using the LP-CVD process. Impurities are introduced to reduce the resistance of the Poly-Si, and the photolithography process is used to execute patterning and etching to form the gate electrode 3. Subsequently, concentrated impurities are introduced into the well region using the self-alignment process and ion injection process, and heat treatment is applied to form a source and a drain regions. Then, an insulating film is deposited using the CVD process, and heat treatment is applied for reflowing. Then, the photolithography process is used to execute patterning and etching processing in order to form a contact hole, a metal film is deposited using the PVD process, and patterning and etching processing is executed again to form the metal electrode wiring 5. Subsequently, the first interlayer insulating film 6 is deposited using various CVD processes, the SOG film 7 is coated thereon using the rotational coating process, and after heat treatment, the second interlayer insulating film 8 using various CVD processes. Subsequently, a through-hole is formed, a metal film constituting a multilayer wiring and a reflector is deposited, and patterning and etching processing is repeated to form the multilayer wiring and reflector.

This interlayer insulating film formation process, however, uses an SOG film containing phosphorous for flattening, thereby requiring the etch back process for preventing the metal wiring from being corroded. The etch back process removes the SOG from the part contacted by the metal wiring to prevent corrosion, but it also reduces the capability of covering a step in a concave and the flatness of the interlayer insulating film, causing an open circuit in the multilayer metal wiring.

In addition, the high internal stress of the SOG film prevents its thickness from being increased. An organic SOG film can be used to compensate for this disadvantage, but also requires the etch back process due to its organic components. Thus, this film is also insufficiently reliable in terms of the metal wiring.

The stress of the phosphorous-containing SOG prevents its thickness from being increased, but the size of an SOG trap increases with decreasing length between the metal wirings. Particularly if the metal wiring is long and the length between the wirings is small, cracks often occur to increase leakage between the metal wirings or to reduce the yield.

SUMMARY OF THE INVENTION

It is a first object of this invention to improve the reliability of a multilayer metal wiring and the electric characteristics of a display apparatus by irradiating an inorganic SOG film with ozone or active oxygen atoms using an ultraviolet light of a particular wavelength (172, 185, or 254 nm) in an atmosphere containing oxygen components, or irradiating the inorganic SOG film with $O_2$ plasma to modify the surface of the film and then forming a different organic SOG film thereon to significantly reduce the unevenness of an interlayer insulating film in order to flatten the film.

It is a second object of this invention to provide an invention capable of flattening the surface of the interlayer insulating film.

It is a third object of this invention to provide an invention capable of flattening the surface of the interlayer insulating film without the needs for CMP (Chemical Mechanical Polishing) processing.

It is a fourth object of this invention to provide an invention that improves the crack resistance of the interlayer insulating film.

It is a fifth object of this invention to provide an invention that increases the efficiency of a reflector and the reliability of a multilayer metal wiring to improve the yield.

It is yet another object of this invention to provide a process for manufacturing an interlayer insulating film characterized by a process for forming an interlayer insulating film using an SOG film comprising the steps of:

irradiating a first inorganic SOG film with an ultraviolet light in an atmosphere containing oxygen components to generate ozone and active oxygen atoms in order to irradiate the film with these atoms; and forming a second inorganic SOG film thereon.

This invention includes an inorganic SOG film formed between a first and a second interlayer insulating films.

This invention also includes an inorganic SOG film not containing phosphorous.

This invention includes the steps of forming the second inorganic SOG film to reduce or eliminate a step in a concave and voids in an element separation and an element formation regions.

It is still another object of this invention to provide a process for manufacturing an interlayer insulating film characterized by a process for forming an interlayer insulating film using an SOG film comprising the steps of:

irradiating a first inorganic SOG film with an ultraviolet light in an atmosphere containing oxygen components to generate ozone and active oxygen atoms in order to irradiate the film with these atoms, thereby cutting the hydrogen radicals off from the top surface film of the first inorganic SOG film; and forming a second inorganic SOG film thereon.

According to this invention, the wavelength of the ultraviolet is 100 to 300 nm.

It is still another object of this invention to provide a process for manufacturing an interlayer insulating film characterized by a process for forming an interlayer insulating film using an SOG film comprising the steps of:

irradiating a first inorganic SOG film with $O_2$ plasma; and forming a second inorganic SOG film thereon.

It is still another object of this invention to provide a semiconductor device having an interlayer insulating film characterized in that the device has on a metal wiring an interlayer insulating film comprising a plurality of insulating films and inorganic SOG films.

It is still another object of this invention to provide a process for manufacturing a semiconductor device having an interlayer insulating film characterized in that the process comprises repeating the steps of forming an insulating film on a metal wiring and forming an inorganic SOG film thereon in order to form an interlayer insulating film of a multilayer structure including the insulating and inorganic SOG films.

It is still another object of this invention to provide a method for manufacturing a display apparatus including a semiconductor device having an interlayer insulating film characterized in that the interlayer insulating film is manufactured using the process for manufacturing an interlayer insulating film.

According to this invention, in the process for forming an interlayer insulating film using an SOG film, an inorganic SOG film is coated on an insulating film, which is then irradiated with a UV light of a particular wavelength (172, 185, or 254 nm) in an atmosphere containing oxygen components or $O_2$ plasma to modify the surface of the inorganic SOG film, and a different film of inorganic SOG film is then formed. Thus, a step in a concave on an insulating film or between metal wirings is significantly reduced to substantially improve the flatness of the surface of the interlayer insulating film. As a result, a multilayer metal wiring can be formed easily and its reliability can be improved to achieve a high yield.

Furthermore, according to this invention, an interlayer insulating film used with inorganic SOG films in a multilayer structure is formed between the inorganic SOG films in a direction in which the internal stress of the inorganic SOG decreases in order to provide a reliable metal wiring and a flat interlayer insulating film without the needs for the etch back process.

In addition, according to this invention, when the contact aperture diameter is 0.6 to 1.2 $\mu$m and the wiring interval is 0.5 to 1.5 $\mu$m, an interlayer insulating film used with inorganic SOG films in a multilayer structure can be formed to significantly improve the flatness without the use of CMP processing during the interlayer insulating film formation step.

Furthermore, according to this invention, a contact hole is formed to have a diameter of 0.5 to 1.2 $\mu$m, the wiring interval is maintained at 0.5 to 2 $\mu$m, an insulating film is formed on the wiring, and an inorganic SOG film is then formed thereon. Then, the films are irradiated with a UV light of wavelength 172, 185, or 254 nm or $O_2$ plasma to modify the surface of the inorganic SOG film in order to improve wettability. Then, an inorganic SOG film is again formed, an insulating film is deposited thereon, and an inorganic SOG film is again formed thereon, followed by the deposition of an insulating film. In this manner, almost perfect flatness can be achieved without the use of CMP processing during the interlayer insulating film formation step, thereby improving the crack resistance and providing a dense and reliable multilayer metal wiring and a reflector of a high reflectance. Therefore, this invention can improve the performance and yield of a semiconductor device or a display apparatus.

BRIEF DESCRIPTION OF THE DRAWINGS

FIGS. 5A, 5B, 5C, 4D, 5E and 5F show examples of a process for filling a step on an interlayer insulating film according to this invention;

FIGS. 12A, 12B and 12C are image drawings showing an example of a projection display apparatus according to this invention;

FIGS. 13A, 13B and 13C are characteristics diagram for the spectral reflectance of a dichroic mirror used in the projection display apparatus according to this invention;

DETAILED DESCRIPTION OF THE PREFERRED EMBODIMENTS

Figure 1A:
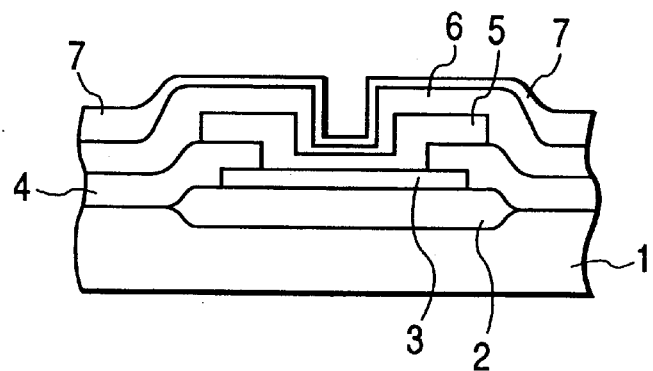
FIGS. 1A, 1B and 1C are sectional views showing an example of a process for forming an interlayer insulating film according to this invention.

A first embodiment of this invention is characterized by a process for forming an interlayer insulating film using an SOG comprising coating an inorganic SOG on an insulating film, irradiating the surface of the inorganic SOG with a UV light or $O_2$ plasma, coating a different inorganic SOG on the inorganic SOG film, subjecting the films to heat treatment, and depositing an insulating film on the inorganic SOG film to provide a structure including a plurality of interlayer insulating films.

According to this configuration, when the inorganic SOG film coated on the insulating film is irradiated with a UV light of a particular wavelength or $O_2$ plasma, the surface of the inorganic SOG film is modified to have its wettability improved, thereby enabling another layer of inorganic SOG film to be coated thereon.

In addition, since impurities such as phosphorous are not mixed in the inorganic SOG film, the etch back process is not required.

Thus, since the surface of the inorganic SOG film is modified to allow a multilayer structure to be formed and the insulating film is further deposited thereon, the unevenness of the surface of the interlayer insulating film is substantially reduced and concaves can be filled without producing a void between metal wirings. Consequently, the surface of a semiconductor substrate can be flattened in such a way that the unevenness is not reflected on the surface of the interlayer insulating film.

The improved flatness of the interlayer insulating film serves to improve the reliability of the subsequent formation of multilayer metal wiring, thereby improving the reliability of the electric characteristics of a display apparatus and increasing the yield.

In addition, according to this invention, the step can be significantly reduced when the metal wiring interval is 0.3 to 4.0 $\mu$m and when the step in a concave in an insulating film in an element separation region is 1.5 $\mu$m or less, and the concave can be completely filled when the metal wiring interval is 0.5 to 2.5 $\mu$m and when the step is 1.0 $\mu$m or less.

Another embodiment of this invention is characterized in that an inorganic SOG film of a multilayer structure is formed in an interlayer insulating film.

In addition, another embodiment of this invention is characterized in that the process comprises forming an inorganic SOG film of a multilayer structure in an interlayer insulating film, irradiating the film with a UV light of a particular wavelength or $O_2$ plasma, again forming an inorganic SOG film, depositing an insulating film thereon, again forming an inorganic SOG film thereon, and further depositing an insulating film thereon, thereby improving the flatness of the interlayer insulating film so as to eliminate the needs for CMP processing.

In addition, yet another embodiment of this invention is characterized in that the process forms a contact hole of contact opening diameter 0.6 to 1.2 μm, forms a metal electrode wiring of wiring interval 0.5 to 1.5 μm, forms one layer of inorganic SOG film in part of an interlayer insulating film, and then irradiates the film with a UV light of 172, 185, or 254 nm wavelength to cut hydrogen radicals off from the surface of the inorganic SOG film in order to improve wettability, again forming an inorganic SOG film thereon, and further depositing an insulating film thereon, once again forming an inorganic SOG film, and further depositing an insulating film thereon, thereby improving the flatness of the interlayer insulating film so as to eliminate the needs for CMP processing.

This invention is described below with reference to its embodiments.

First Embodiment

Figure 1B:
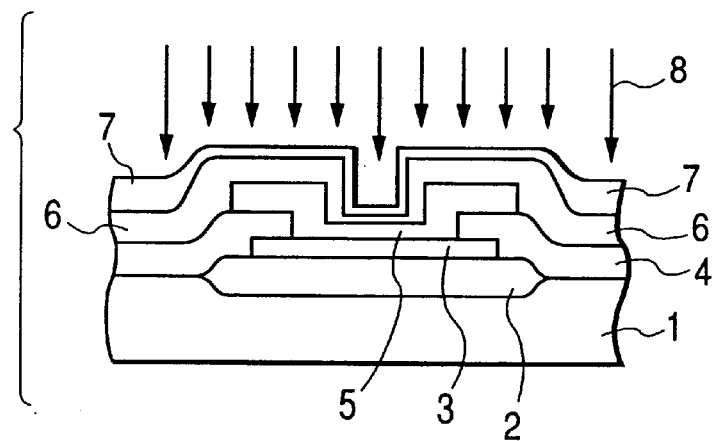
Figure 1C:
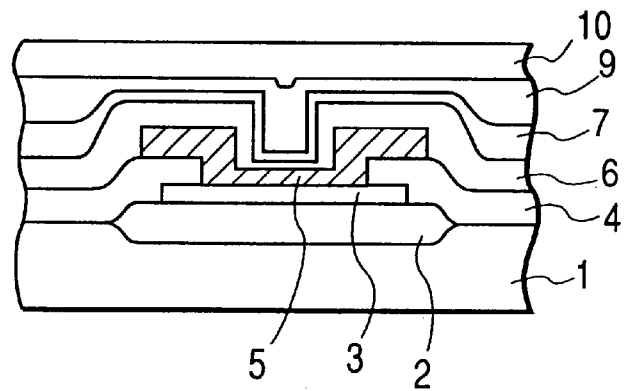

FIGS. 1A to 1C are process flows showing one embodiment of this invention best, and is a schematic sectional view of a semiconductor device in a circuit for driving a display apparatus.

In this figure, 1 is a semiconductor substrate, 2 is an insulating oxide film, 3 is a polycrystal silicon, 4 is an insulating film, 5 is a metal wiring, 6 is a first interlayer insulating film, 7 is an inorganic SOG, 8 is a surface-modifying UV light, 9 is an inorganic SOG, and 10 is a second interlayer insulating film.

The process flow in FIGS. 1A to 1C are described. In FIG. 1A, 1 is a semiconductor substrate on which a circuit is fabricated that drives a display apparatus. Reference numeral 2 designates a field oxide film formed to be 8,000 Å using the selective oxidation process and vapor oxidation at 1,050° C.

Polycrystal silicon is deposited on the field oxide film, impurities are introduced, the layer is heat-treated, and the photolithography process is used to execute patterning to form the polycrystal silicon 3. According to this invention, the thickness of the polycrystal silicon 3 is 4,400 Å. Of course, the polycrystal silicon 3 may be combined with metal such as W.

Next, the insulating film 4 is formed using the CVD process. Although this example deposits a 7,000 Å BPSG film, an NSG or a PSG film or their combination may be deposited. The polycrystal silicon 3 is then heat-treated and patterned to open a contact hole thereon. The sputtering process is used to deposit a metal film, and patterning is executed to form the metal wiring 5. According to this invention, the metal wiring 5 is formed by combining Ti/TiN and Al—Si/TiN together to deposit an 8,000 Å layer. These materials may be combined with other wiring metal, for example, Al—Cu—Ti or Al—Cu.

Next, the first interlayer insulating film 6 is formed. According to this example, 5,000 Å of P—SiO is deposited using the plasma-CVD process, but the insulating film may comprise P—SiN or TEOS or their combination.

Next, the inorganic SOG film 7 is coated all over the surface using the rotating coating method. The film must comprise inorganic SOG instead of P-containing SOG or organic SOG.

Although this example coats a 2,200 Å inorganic SOG film, this thickness may vary between 500 and 4,000 Å depending on the width or interval of metal wirings or the amount of step. If, however, the thickness is larger than 4,000 Å, the stress of the film causes voids to be formed. Thus, the thickness must be 4,000 Å or smaller.

Next, as shown in FIG. 1B, the inorganic SOG film 7 is irradiated with the surface-modifying UV light 8 all over the surface. The surface-modifying UV light 8 has a wavelength of 100 to 300 nm and must be able to generate active oxygen. In particular, this wavelength is preferably 172, 185, or 254 nm.

This example irradiates the surface of the inorganic SOG film 7 with a 185 or 254 nm wavelength in an oxygen atmosphere for 60 seconds to generate $O_2$ and active oxygen atoms in order to modify this surface. Due to their high energy, active oxygen atoms can cut hydrogen radicals off from the top surface of the inorganic SOG film 7 that is hydrogen-terminated. It is important in this invention to use this effect to modify the surface.

In addition, a UV light of 172 nm wavelength allows active oxygen atoms to be generated more efficiently to enhance the effect of modifying the surface.

Furthermore, as a similar surface modifying process, the inorganic SOG film 7 may be irradiated with $O_2$ plasma to obtain the same surface modifying effect. To obtain effects similar to those of this example, 1-kW $O_2$ plasma is provided for 60 seconds.

One more inorganic SOG film 9 is formed on the surface-modified inorganic SOG film 7, using the rotating coating method. Although, in this example, the thickness of the inorganic SOG film 9 is 2,200 Å, it may vary between 500 and 4,000 Å depending on the wiring interval, the amount of step, and the capability of filling steps. This invention can significantly reduce the unevenness of the interlayer insulating film if the interval between the metal wirings is between 0.3 and 4.0 μm, and in particular, can almost perfectly flatten the surface if the interval is between 0.8 and 2.5 μm.

In addition, the concave in the first interlayer insulating film 6 on the contact hole can be filled without voids or other concaves if the amount of step is 1.5 μm or less, and in particular, can be filled flat if it is 1.0 μm or less. If the amount of step in the concave or the metal wiring interval is larger, the thicknesses of the inorganic SOG films 7 and 9 may be increased.

In addition, this invention is not limited to two inorganic SOG films, high effects can be achieved using the above present steps even if three or more inorganic SOG films are laminated.

According to this invention, heat treatment at 400° C. is then applied for 30 minutes, and the second interlayer insulating film 10 is subsequently formed using the P-CVD process, as shown in FIG. 1C. The second interlayer insulating film 10 comprises a 6,000 Å P—SiO film, but the same effects can be obtained using a P—SiN or a TEOS insulating film.

Although not shown, a through-hole is subsequently formed by patterning, and a second metal wiring is formed, followed by the deposition of a protective film, the final patterning, and the final heat treatment step. Thus, a semiconductor device and a display apparatus are completed.

Second Embodiment

Figure 2A:
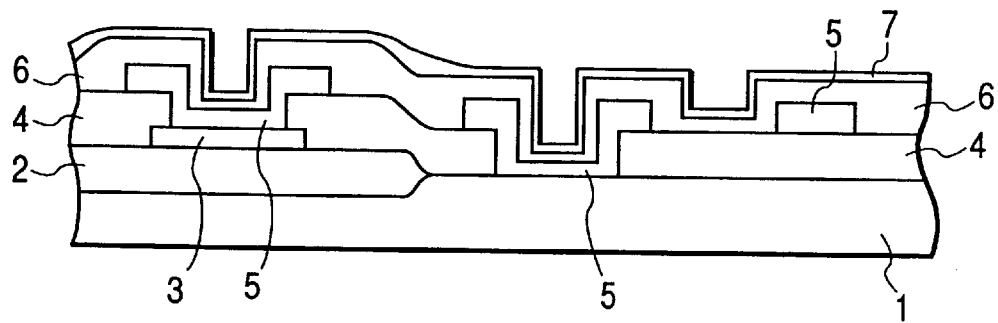
FIGS. 2A, 2B and 2C are sectional views showing an example of a process for forming an interlayer insulating film according to this invention.
Figure 2B:
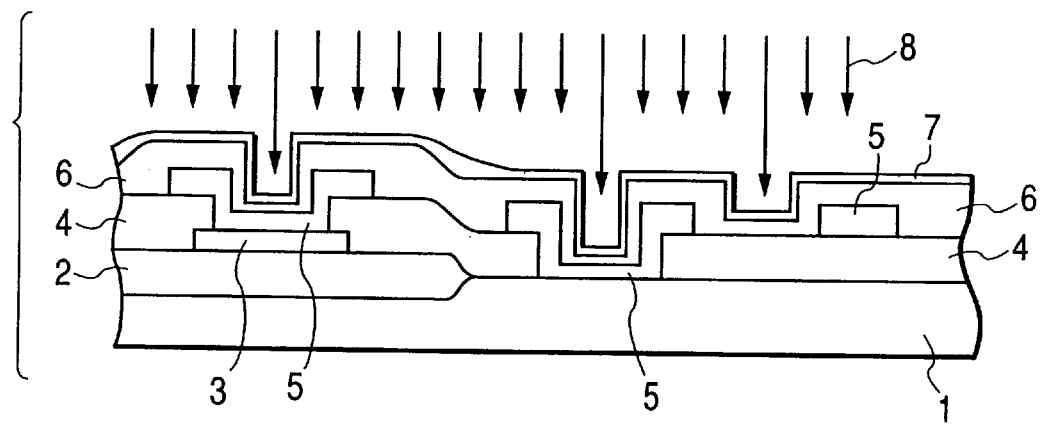
Figure 2C:
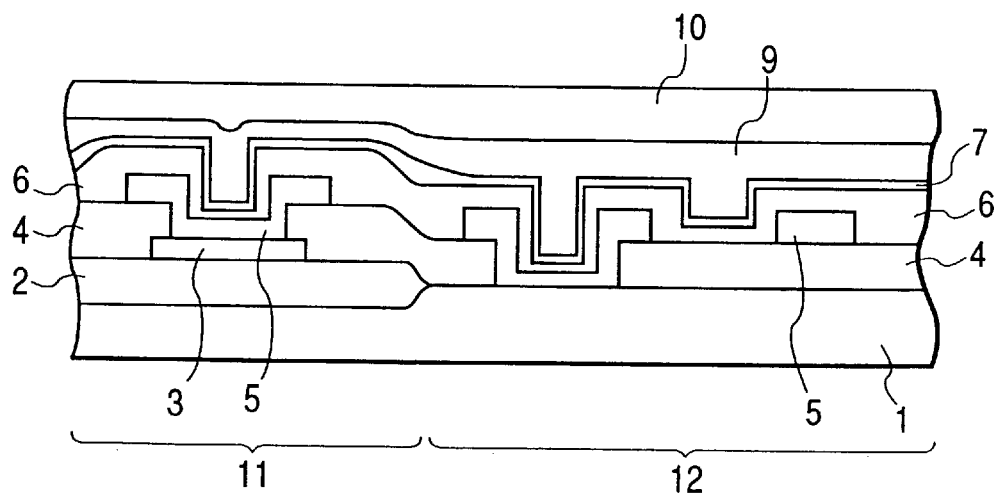

FIGS. 2A to 2C are process flows showing another embodiment of this invention best, and is a schematic sectional view of a semiconductor device in a drive circuit for a display apparatus.

In this figure, 1 is a semiconductor substrate, 2 is an insulating oxide film, 3 is a polycrystal silicon, 4 is an insulating film, 5 is a metal wiring, 6 is a first interlayer insulating film, 7 is an inorganic SOG, 8 is a surface-modifying UV light, 9 is an inorganic SOG, 10 is a second interlayer insulating film, 11 is an element separation region, and 12 is an element formation area.

The process flow in FIGS. 2A to 2C are described. In FIG. 2A, 1 is a semiconductor substrate on which a circuit is fabricated that drives a display apparatus. Reference numeral 2 designates a field oxide film formed to be 8,000 Å using the selective oxidation process and vapor oxidation at 1,050° C.

Polycrystal silicon is deposited on the field oxide film, impurities are introduced, the layer is heat-treated, and the photolithography process is used to execute patterning to form the polycrystal silicon 3.

According to this invention, the thickness of the polycrystal silicon 3 is 4,400 Å. Of course, the polycrystal silicon 3 may be combined with metal such as W.

Next, the insulating film 4 is formed using the CVD process. Although this example deposits a 7,000 Å BPSG film, an NSG, a PSG, or a TEOS insulating film or their combination may be deposited. The polycrystal silicon 3 is then heat-treated and patterned to open a contact hole thereon. The sputtering process is used to deposit a metal film, and patterning is executed to form the metal wiring 5. According to this invention, the metal wiring 5 is formed by combining Ti/TiN and Al—Si/TiN together to deposit an 8,000 Å layer. These materials may be combined with other wiring metal, for example, Al—Cu—Ti or Al—Cu.

Next, the first interlayer insulating film 6 is formed. According to this example, 5,000 Å of P—SiO is deposited using the plasma-CVD process, but the insulating film may comprise P—SiN or TEOS or their combination.

Next, the inorganic SOG film 7 is coated all over the surface using the rotating coating method. The film must comprise inorganic SOG instead of P-containing SOG or organic SOG.

Although this example coats a 2,200 Å inorganic SOG film, this thickness may vary between 500 and 4,000 Å depending on the width or interval of metal wirings or the amount of step. If, however, the thickness is larger than 4,000 Å, the stress of the film causes voids to be formed. Thus, the thickness must be 4,000 Å or smaller.

Next, the inorganic SOG film 7 is irradiated with the surface-modifying UV light 8 all over the surface. The surface-modifying UV light 8 has a wavelength of 100 to 300 nm and must be able to generate active oxygen (FIG. 2B).

This example irradiates the surface of the inorganic SOG film 7 with a 185 or 254 nm wavelength in an oxygen atmosphere for 60 seconds to generate $O_3$ and active oxygen atoms in order to modify this surface. Due to their high energy, active oxygen atoms can cut hydrogen radicals off from the top surface of the inorganic SOG film 7 that is hydrogen-terminated. It is important in this invention to use this effect to modify the surface.

In addition, a UV light of 172 nm wavelength allows active oxygen atoms to be generated more efficiently to enhance the effect of modifying the surface.

Furthermore, as a similar surface modifying process, the inorganic SOG film 7 may be irradiated with $O_2$ plasma to obtain the same surface modifying effect. To obtain effects similar to those of this example, 1-kW $O_2$ plasma is provided for 60 seconds.

One more inorganic SOG film 9 is formed on the surface-modified inorganic SOG film 7, using the rotating coating method. Although, in this example, the thickness of the inorganic SOG film 9 is 2,200 Å, it may vary between 500 and 4,000 Å depending on the wiring interval, the amount of step, and the capability of filling steps.

This invention can significantly reduce the unevenness of the interlayer insulating film if the interval between the metal wirings is between 0.3 and 4.0 μm, and in particular, can almost perfectly flatten the surface if the interval is between 0.8 and 2.5 μm.

In addition, the concave in the first interlayer insulating film 6 on the contact hole can be filled without voids or other concaves if the amount of step is 1.5 μm or less. Particularly, the concave or step can be perfectly filled flat by forming the inorganic SOG films 7 and 9 to be 2,000 Å or more in thickness, even if the amount of step between the element separation and element formation regions 11 and 12 is 1.0 μm or more, and if the amount of step in the concave is 1.0 μm or more.

According to this invention, heat treatment at 400° C. is then applied for 30 minutes, and the second interlayer insulating film 10 is subsequently formed using the P-CVD process. The second interlayer insulating film 10 comprises a 6,000 Å P—SiO film, but the same effects can be obtained using a P—SiN or a TEOS insulating film (FIG. 2C).

Although not shown, a through-hole is subsequently formed by patterning, and a second metal wiring is formed, followed by the deposition of a protective film, the final patterning, and the final heat treatment step. Thus, a semiconductor device and a display apparatus are completed.

Third Embodiment

FIGS. 3A to 3F are sectional views of process flows showing the filling of a contact hole in a process for forming an interlayer insulating film in a semiconductor device using this invention.

In this figure, 1 is a semiconductor substrate, 2 is a LOCOS insulating film, 3 is a gate electrode, 4 is a BPSG film, 5 is a metal wiring electrode, 6 is a first interlayer insulating film, 7 is a first inorganic SOG film, 8 is a second interlayer insulating film, 9 is a second inorganic SOG film, and 10 is a third interlayer insulating film.

This example is described with reference to FIGS. 3A to 3F.

First, a process for forming a MOS transistor in semiconductor substrate is shown below. A thermally oxidized film (a pad oxidized film) is formed on a semiconductor substrate 1 of impurity concentration 1E14 to 1E15 $cm^{-3}$ using the thermal oxidation process, and an SiN film is deposited thereon using the LP-CVD process. This example deposits a 350 Å thermally oxidized film and a 2,000 Å SiN film.

Next, the photolithography step is used to execute patterning and etching processing to remove part of the SiN film, P (phosphorous) is injected using the ion injection method, and the substrate is subsequently heat-treated to form a well region. This example injects 1.8E12 $cm^{-2}$ of P so that the concentration of impurities formed by the ion injection is 1E15 to 1E17 $cm^{-3}$, and carries out heat treatment in an $N_2/O_2$ atmosphere at 1,000° C. for 60 minutes.

Furthermore, after all the SiN film has been removed, this example ion-injects B (boron) and then applies heat treatment to form a well region having a different conductivity. The concentration of impurities is similar to that in the well region.

An SiN film is again deposited using the LP-CVD process, the photolithography step is used to execute patterning to remove part of the SiN film, and a thermally oxidized film is formed using the thermal oxidization process. According to this invention, the thickness of the SiN film is 1,500 Å and the thickness of the thermally oxidized film is 8,000 Å. All the SiN film is subsequently removed and the LOCOS insulating film 2 is formed (FIG. 3A).

Next, the gate oxide film is formed using the thermal oxidization process, and impurities used to adjust thresholds are introduced using the ion injection process. According to this example, the thickness of the gate oxide film is 850 Å, and B (boron) at 4E11 $cm^{-2}$ and 40 KeV are injected under the gate oxide film as impurities.

Figure 3A:
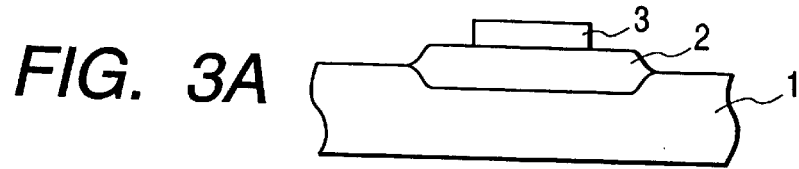
FIGS. 3A, 3B, 3C, 3D, 3E and 3F show examples of a process for filling a concave in a contact hole on an interlayer insulating film according to this invention.

Next, polycrystal Si is deposited on the gate oxide film using the LP-CVD process, impurities are injected all over the surface, the layer is heat-treated, and the patterning process is used to form the gate electrode 3 (FIG. 3A).

This example deposits 4,400 Å of polycrystal Si, injects P (phosphorous) at 1.5E16 $cm^{-2}$ and 70 KeV, heat-treats the layer in an $N_2$ atmosphere at 950° C. for 30 minutes, and then executes patterning and etching to form the gate electrode 3.

The gate electrode 3 may comprise a combination of high-melting-point metal such as W or Co and polycrystal Si. Furthermore, to improve the voltage resistance of the gate oxide film, this example forms a 350 Å thermally oxidized film on the gate electrode 3 using the thermal oxidization process.

Next, the resist patterning process is used to open the resist around the gate electrode 3, and impurities are injected into the opening. The impurities have a conductivity opposite to that of the well region, and are subjected to heat treatment. According to this example, the well region is of a P type and is subjected to heat treatment so that the surface concentration of P (phosphorous) becomes 1 to 8E17 $cm^{-3}$. This region becomes a field reduction layer to improve the voltage resistance of the MOS transistor. Furthermore, this example, B (boron) is ion-injected into an N-type well region, which is then subjected to heat treatment so that the surface concentration of B becomes 1E16 to 1E17 $cm^{-3}$ to form a field reduction layer.

Next, the resist patterning process is used to open the resist around the gate electrode 3, and N-type impurities are injected into the P-type well region. After the resist is removed, patterning is executed again to open the resist around the gate electrode on the N-type well region, and P-type impurities are injected into the N-type well region. According to this example, the N-type impurities comprise P (phosphorous) at 5E15 $cm^{-2}$ and 95 KeV, while the P-type impurities comprise $BF_2$ at 3E15 $cm^{-2}$ and 100 KeV. After the resist is removed, heat treatment is applied in an $N_2$ atmosphere at 1,000° C. for 10 minutes to diffuse the impurities in order to form a source and a drain regions in the P- and N-type well regions.

According to this example, the source and drain regions are made offset by resist patterning. The amount of offset is preferably 0.5 to 2.0 μm. To provide an offset, concentrated impurities may be introduced into side spacers provided on the respective sides of the gate electrode.

Figure 3B:
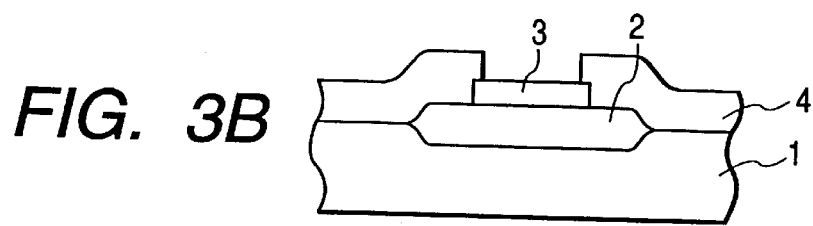

Next, an insulating film is deposited using the CVD process. Although this example deposits the BPSG film 4 using the atmospheric TEOS CVD process, a different CVD process may be used or multiple insulating films may be combined together (FIG. 3B). Subsequently, the BPSG film 4 is heat-treated in an $N_2$ atmosphere at 1,000° C. for 5 minutes for reflowing.

Next, the photolithography step is used to execute patterning and etching in order to open contact holes on the source and drain regions. After the resist is removed, the PVD process is used to deposit a metal film for wiring and electrodes. Although this example deposits barrier metal consisting of Ti and TiN, heat-treats this metal, and continuously forms an Al—Si and a TiN films thereon, materials such as Al—Si—Cu, Al—Cu, and Al—Cu—Ti may be used.

Figure 3C:
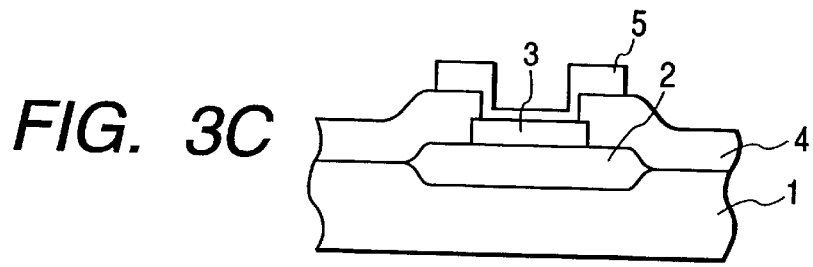

Next, the metal wiring electrode wiring 5 is formed using the photolithography step (FIG. 3C). The wiring interval is 1 μm according to this example but may be 0.5 to 5 μm.

Then, the first interlayer insulating film 6 is deposited by P-CVD. Although this example uses the P-CVD process to deposit a 1,000 Å P—SiO film, this insulating film may comprise P—SiN or P—SiON, or a film obtained by the P-TEOS process.

Figure 3D:
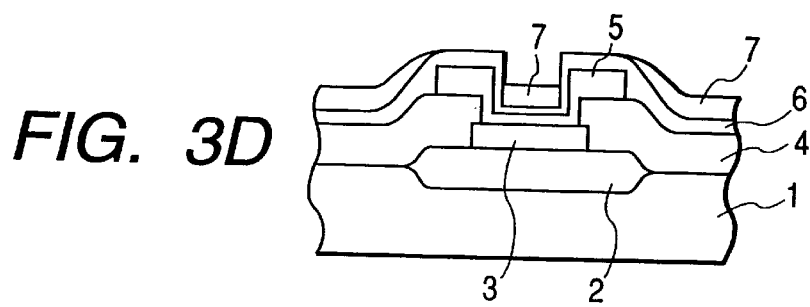
Figure 3E:
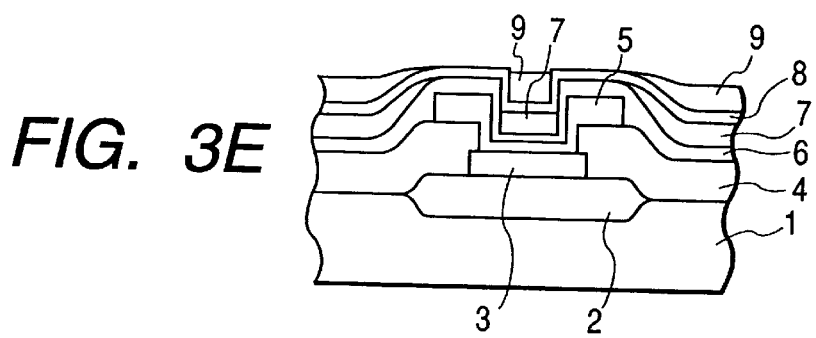
Figure 3F:
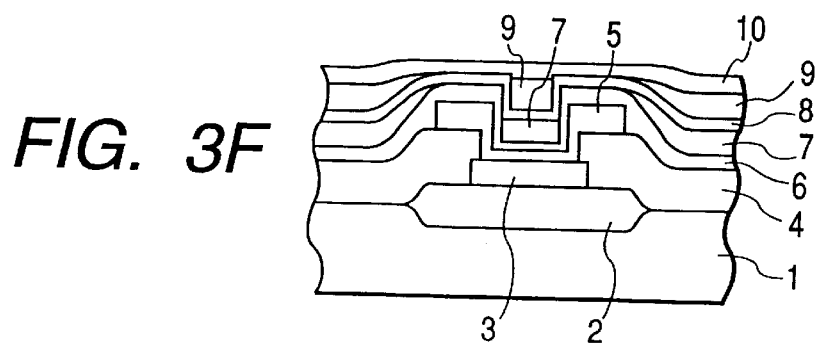

Then, the rotating coating process is used to coat the first inorganic SOG film 7. This example forms a 2,200 Å inorganic SOG film (FIG. 3D).

Subsequently, the film is heat-treated at 400° C. for 30 minutes, and the P-CVD process is used to deposit the second interlayer insulating film 8. Although this example uses the P-CVD process to deposit a 2,000 Å P—SiO film, this insulating film may comprise P—SiN or P—SiON, a combination of multiple films, or a film obtained by the P-TEOS process.

Then, the rotating coating process is used again to coat the second inorganic SOG film 9. This example forms a 2,200 Å inorganic SOG film. Subsequently, the film is heat-treated at 400° C. for 30 minutes, and the P-CVD process is used to deposit the third interlayer insulating film 10. This example forms a 2,000 Å P—SiO film.

This example is characterized in that the concave created due to the contact between the gate electrode 3 and the metal wiring electrode 6 is filled with the insulating film/inorganic SOG film/insulating film/inorganic SOG film.

Furthermore, according to this example, the insulating film between the first and second inorganic SOG films comprises a P—SiO film, and is deposited at 450° C. using $SiH_4$ and $N_2O$ in such a way that the film stress acts in the direction of compression.

Since the inorganic SOG film has a film stress acting in the tensile direction, the P—SiO film is formed between the inorganic SOG films to reduce their stress.

Figure 6:
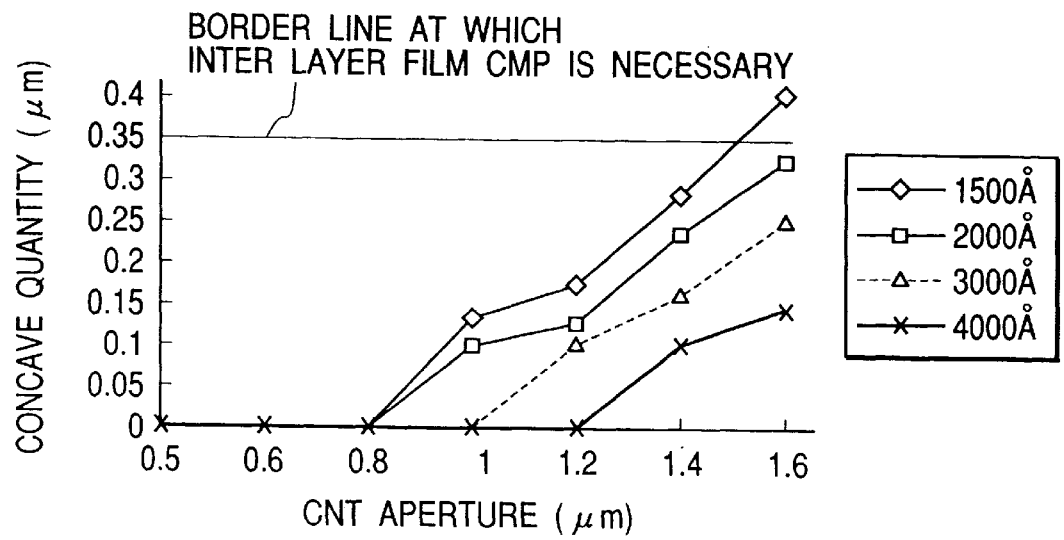
FIG. 6 is a graph showing a technical verification of the capability of filling a concave on a contact hole.

With respect to the quality of the P—SiO, the magnitude or direction of the stress can be varied using the thickness of the inorganic SOG film filled over contact hole and between wirings, and the thickness can be similarly varied. FIG. 6 shows the relationship between the amount of concave created due to the size of the contact hole and the thickness of the first and second inorganic SOG films filling the concave. The inorganic SOG film is effective in improving the flatness of the interlayer insulating film when its thickness is between 1,500 and 4,000 Å Although this example forms the inorganic SOG film so as to be 2,200 Å in thickness, the contact opening diameter between 0.5 and 1.4 μm is effective in filling the concave, and in particular, the contact opening diameter between 0.6 and 1.2 μm serves to reduce the amount of concave down to 0.1 μm or less to substantially improve the flatness.

In the subsequent photolithography step, the dry etch process is used to open in the interlayer insulating film a through-hole required to provide conduction to the first metal wiring. Then, the PVD process is used to deposit metal for multilayer wiring, patterning and etching are executed to form a multilayer metal wiring, or the Al reflow process and then the CMP processing are executed to form a reflector (FIG. 9).

Figure 9:
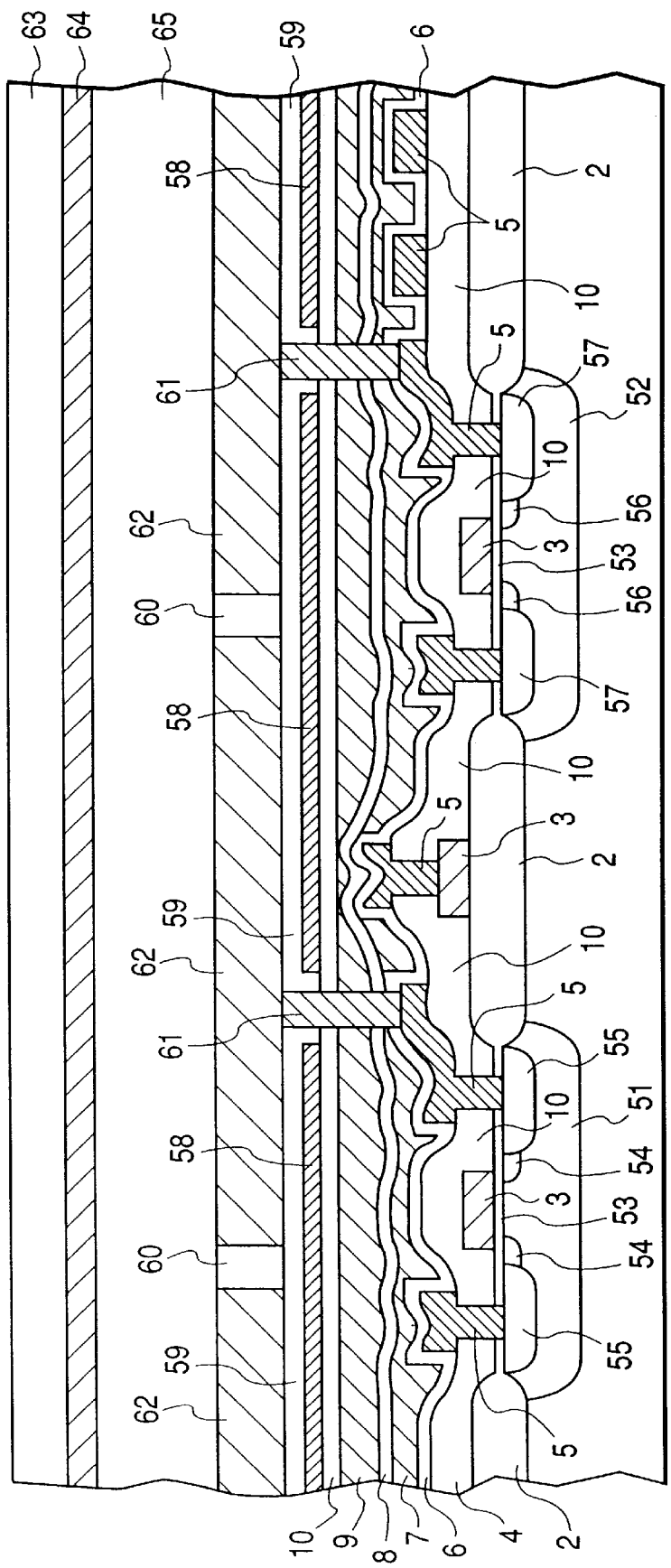
FIG. 9 is a sectional view of a liquid crystal display apparatus formed using this invention.
Figure 10:
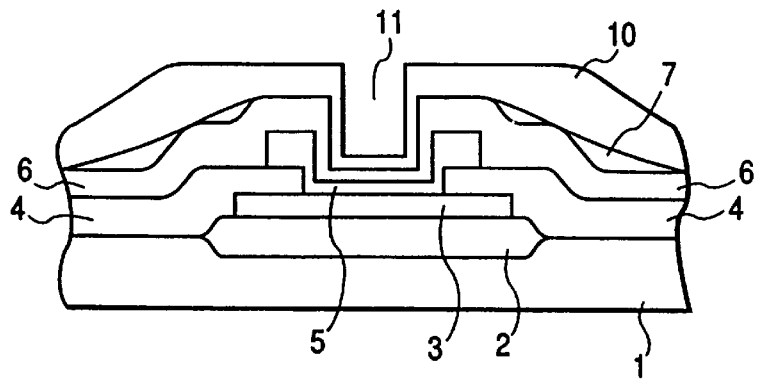
FIG. 10 is a sectional view showing a process for forming an interlayer insulating film according to a conventional technique.
Figure 11:
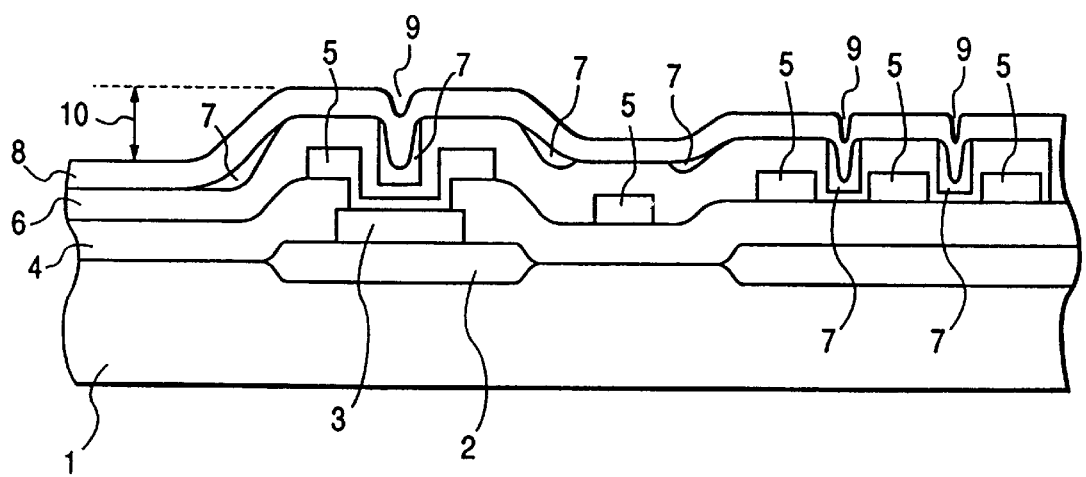
FIG. 11 illustrates a conventional example.
Figure 14:
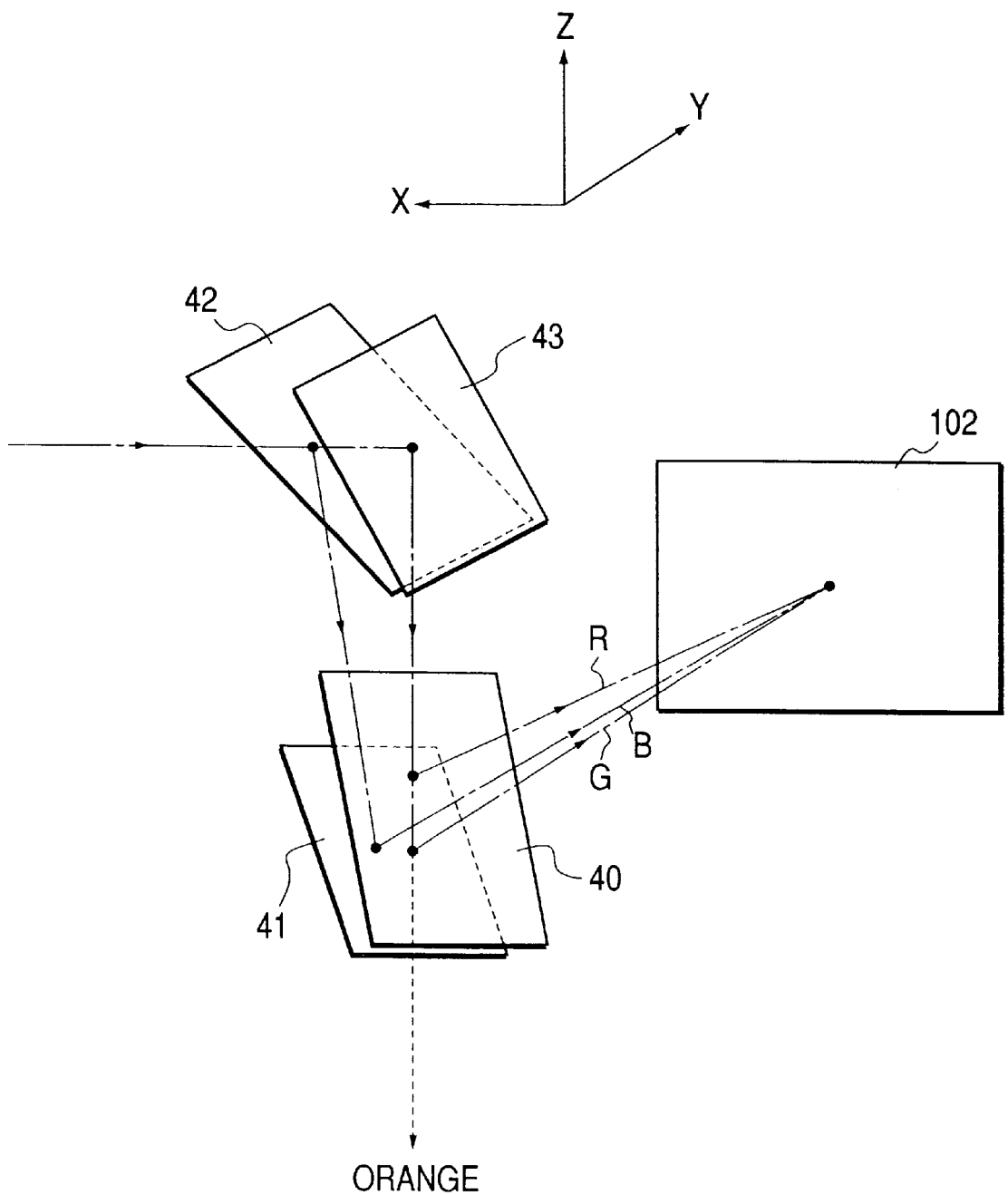
FIG. 14 is a perspective view of a color separation illuminating section of the projection display apparatus according to this invention.

A liquid crystal panel is formed by sandwiching a liquid crystal 65 between an active matrix substrate formed in the above manner and an opposed substrate 63 on which a transparent electrode 64 is formed (FIG. 9). The liquid crystal material comprises a polymer network liquid crystal PNLC, but PDLC may be used as the polymer network liquid crystal.

This embodiment is technically effective in making the interlayer insulating film flat enough to eliminate the needs for the CMP operation during the interlayer insulating film formation step, thereby enabling reliable multilayer metal wirings and high-reflectance reflectors to be formed. As a result, highly integrated semiconductor devices and high-pixel-density display apparatuses can be formed to improve performance and yields.

Fourth Embodiment

FIGS. 4A to 4F are sectional views of a process flow showing the filling of a concave between wirings in a process for forming an interlayer insulating film in a semiconductor device using this invention.

In this figure, 1 is a semiconductor substrate, 2 is a LOCOS insulating film, 3 is a BPSG film, 4 is a metal wiring electrode, 5 is a first interlayer insulating film, 6 is a first inorganic SOG film, 7 is a second interlayer insulating film, 8 is a second inorganic SOG film, and 9 is a third interlayer insulating film.

This example is described with reference to FIGS. 4A to 4F.

First, a process for forming a MOS transistor in semiconductor substrate is shown below. A thermally oxidized film (a pad oxidized film) is formed on a semiconductor substrate 1 of impurity concentration 1E14 to 1E15 $cm^{-3}$ using the thermal oxidation process, and an SiN film is deposited thereon using the LP-CVD process. This example deposits a 350 Å thermally oxidized film and a 2,000 Å SiN film.

Next, the photolithography step is used to execute patterning and etching processing to remove part of the SiN film, P (phosphorous) is injected using the ion injection method, and the film is subsequently heat-treated to form a well region. This example injects 1.8E12 $cm^{-2}$ of P so that the concentration of impurities formed by the ion injection is 1E15 to 1E17 $cm^{-3}$, and carries out heat treatment in an $N_2/O_2$ atmosphere at 1,000° C. for 60 minutes.

Furthermore, after all the SiN film has been removed, this example ion-injects B (boron) and then applies heat treatment to form a well region having a different conductivity. The concentration of impurities is similar to that in the well region.

Figure 4A:
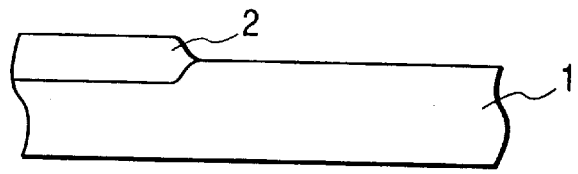
FIGS. 4A, 4B, 4C, 4D, 4E and 4F show examples of a process for filling a concave between wirings on an interlayer insulating film according to this invention.

An SiN film is again deposited using the LP-CVD process, the photolithography step is used to execute patterning to remove part of the SiN film, and a thermally oxidized film is formed using the thermal oxidation process. According to this example, the thickness of the SiN film is 1,500 Å and the thickness of the thermally oxidized film is 8,000 Å. All the SiN film is subsequently removed and the LOCOS insulating film 2 is formed (FIG. 4A).

Next, the gate oxide film is formed using the thermal oxidation process, and impurities used to adjust thresholds are introduced using the ion injection process. According to this example, the thickness of the gate oxide film is 850 Å, and B (boron) at 4E11 $cm^{-2}$ and 40 KeV are injected under the gate oxide film as impurities.

Next, polycrystal Si is deposited on the gate oxide film using the LP-CVD process, impurities are injected all over the surface, the layer is heat-treated, and the patterning process is used to form the gate electrode.

This example deposits 4,400 Å of polycrystal Si, injects P (phosphorous) at 1.5E16 $cm^{-2}$ and 70 KeV, heat-treats the layer in an $N_2$ atmosphere at 950° C. for 30 minutes, and then executes patterning and etching to form the gate electrode.

The gate electrode may comprise a combination of high-melting-point metal such as W or Co and polycrystal Si. Furthermore, to improve the voltage resistance of the gate oxide film, this example forms a 350 Å thermally oxidized film on the gate electrode 3 using the thermal oxidization process.

Next, the resist patterning process is used to open the resist around the gate electrode 3, and impurities are injected into the opening. The impurities have a conductivity opposite to that of the well region, and are subjected to heat treatment. According to this example, the well region is of a P type and is subjected to heat treatment so that the surface concentration of P (phosphorous) becomes 1 to 8E17 $cm^{-3}$. This region becomes a field reduction layer to improve the voltage resistance of the MOS transistor. Furthermore, this example, B (boron) is ion-injected into an N-type well region, which is then subjected to heat treatment so that the surface concentration of B becomes 1E16 to 1E17 $cm^{-3}$ to form a field reduction layer.

Next, the resist patterning process is used to open the resist around the gate electrode 3, and N-type impurities are injected into the P-type well region. After the resist is removed, patterning is executed again to open the resist around the gate electrode on the N-type well region, and P-type impurities are injected into the N-type well region. According to this example, the N-type impurities comprise P (phosphorous) at 5E15 $cm^{-2}$ and 95 KeV, while the P-type impurities comprise $BF_2$ at 3E15 $cm^{-2}$ and 100 KeV. After the resist is removed, heat treatment is applied in an $N_2$ atmosphere at 1,000° C. for 10 minutes to diffuse the impurities in order to form a source and a drain regions in the P- and N-type well regions.

According to this example, the source and drain regions are made offset by resist patterning. The amount of offset is preferably 0.5 to 2.0 μm. To provide an offset, concentrated impurities may be introduced into side spacers provided on the respective sides of the gate electrode.

Figure 4B:
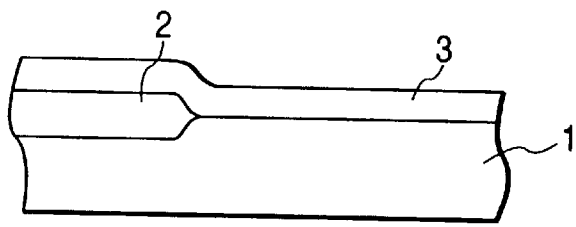

Next, an insulating film is deposited using the CVD process. Although this example deposits the BPSG film 3 using the atmospheric TEOS CVD process, a different CVD process may be used or multiple insulating films may be combined together (FIG. 4B).

Subsequently, the BPSG film 3 is heat-treated in an $N_2$ atmosphere at 1,000° C. for 5 minutes for reflowing.

Next, the photolithography step is used to execute patterning and etching in order to open contact holes on the source and drain regions. After the resist is removed, the PVD process is used to deposit a metal film for wiring and electrodes. Although this example deposits barrier metal consisting of Ti and TiN, heat-treats this metal, and continuously forms an Al–Si and a TiN films thereon, materials such as Al—Si—Cu, Al—Cu, and Al—Cu—Ti may be used.

Figure 4C:
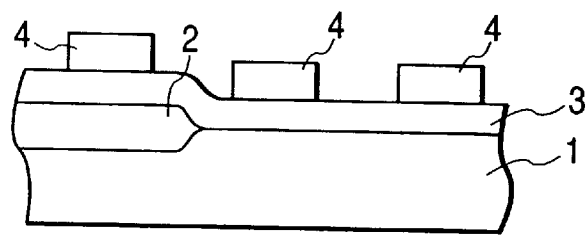

Next, the metal wiring electrode wiring 4 is formed using the photolithography step (FIG. 4C). The wiring interval is 1 μm according to this example but may be 0.5 to 5 μm.

Then, the first interlayer insulating film 5 is deposited by P-CVD. Although this example uses the P-CVD process to deposit a 1,000 Å P—SiO film, this insulating film may comprise P—SiN or P—SiON, or a film obtained by the P-TEOS process.

Figure 4D:
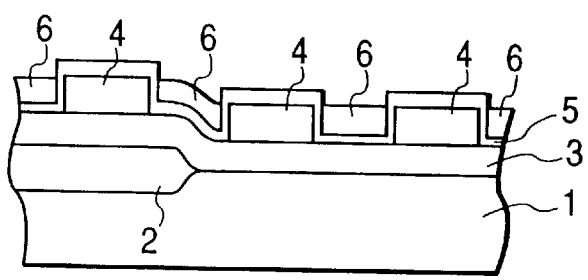
Figure 4E:
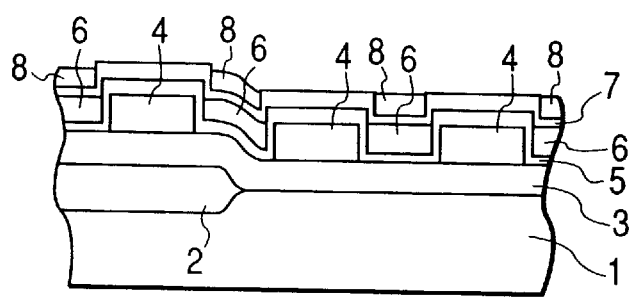
Figure 4F:
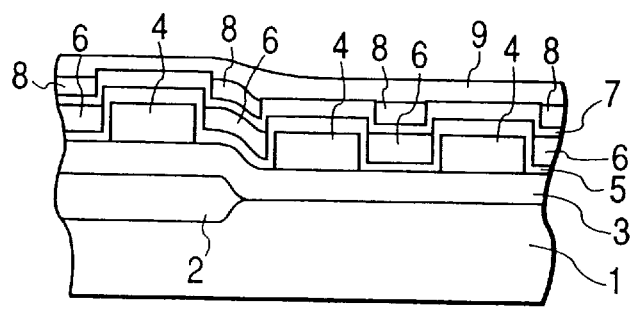

Then, the rotating coating process is used to coat the first inorganic SOG film 6. This example forms a 2,200 Å inorganic SOG film (FIG. 4D).

Subsequently, the film is heat-treated at 400° C. for 30 minutes, and the P-CVD process is used to deposit the second interlayer insulating film 7. Although this example uses the P-CVD process to deposit a 2,000 Å P—SiO film, this insulating film may comprise P—SiN or P—SiON, a combination of multiple films, or a film obtained by the P-TEOS process.

Then, the rotating coating process is used again to coat the second inorganic SOG film 8. This example forms a 2,200 Å inorganic SOG film. Subsequently, the film is heat-treated at 400° C. for 30 minutes, and the P-CVD process is used to deposit the third interlayer insulating film 9. This example forms a 2,000 Å P—SiO film.

This example is characterized in that the concave created between the wirings of the metal electrode wiring 4 is filled with the insulating film/inorganic SOG film/insulating film/inorganic SOG film.

Furthermore, according to this example, the insulating film between the first and second inorganic SOG films comprises a P—SiO film, and is deposited at 450° C. using $SiH_4$ and $N_2O$ in such a way that the film stress acts in the direction of compression.

Since the inorganic SOG film has a film stress acting in the tensile direction, the P—SiO film is formed between the inorganic SOG films to reduce their stress.

Figure 7:
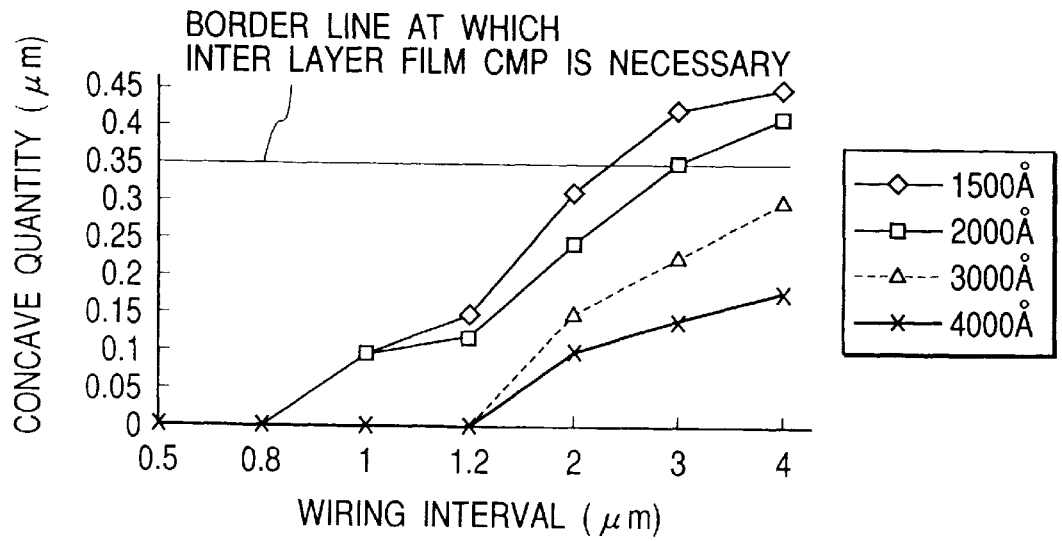
FIG. 7 is a graph showing a technical verification of the capability of filling a concave between wirings.

With respect to the quality of the P—SiO, the magnitude or direction of the stress can be varied using the thickness of the inorganic SOG film filled over contact hole and between wirings, and the thickness can be similarly varied. FIG. 7 shows the relationship between the amount of concave created due to the difference in wiring interval and the thickness of the first and second inorganic SOG films filling the concave.

The inorganic SOG film is effective in improving the flatness of the interlayer insulating film between wirings when its thickness is between 1,500 and 4,000 Å. Although this example forms the inorganic SOG film so as to be 2,200 Å in thickness, the wiring interval between 0.5 and 2.0 $\mu$m is effective in filling the concave, and in particular, the wiring interval between 0.5 and 1.5 $\mu$m serves to reduce the amount of concave down to 0.2 $\mu$m or less to substantially improve the flatness.

In the subsequent photolithography step, the dry etch process is used to open in the interlayer insulating film a through-hole required to provide conduction to the first metal wiring. Then, the PVD process is used to deposit metal for multilayer wiring, patterning and etching are executed to form a multilayer metal wiring, or the Al reflow process and then the CMP processing are executed to form a reflector (FIG. 9).

A liquid crystal panel is formed by sandwiching a liquid crystal 65 between an active matrix substrate formed in the above manner and an opposed substrate 63 on which a transparent electrode 64 is formed (FIG. 9). The liquid crystal material comprises a polymer network liquid crystal PNLC, but PDLC may be used as the polymer network liquid crystal.

This embodiment is technically effective in making the interlayer insulating film flat enough to eliminate the needs for the CMP operation during the interlayer insulating film formation step, thereby enabling reliable multilayer metal wirings and high-reflectance reflectors to be formed. As a result, highly integrated semiconductor devices and high-pixel-density display apparatuses can be formed to improve performance and yields.

Fifth Embodiment

FIGS. 5A to 5F are sectional views of a process flow showing the filling of a step in a process for forming an interlayer insulating film in a semiconductor device using this invention.

In this figure, 1 is a semiconductor substrate, 2 is a LOCOS insulating film, 3 is a gate electrode, 4 is a BPSG film, 5 is a metal wiring electrode, 6 is a first interlayer insulating film, 7 is a first inorganic SOG film, 50 is a UV light, 9 is a second inorganic SOG film, and 10 is a second interlayer insulating film, 11 is a third inorganic SOG film, and 12 is a third interlayer insulating film.

This example is described with reference to FIGS. 5A to 5F.

First, a process for forming a MOS transistor in semiconductor substrate is shown below. A thermally oxidized film (a pad oxidized film) is formed on a semiconductor substrate 1 of impurity concentration 1E14 to 1E15 $cm^{-3}$ using the thermal oxidation process, and an SiN film is deposited thereon using the LP-CVD process. This example deposits a 350 Å thermally oxidized film and a 2,000 Å SiN film.

Next, the photolithography step is used to execute patterning and etching processing to remove part of the SiN film, P (phosphorous) is injected using the ion injection method, and the substrate is subsequently heat-treated to form a well region. This example injects 1.8E12 $cm^{-2}$ of P so that the concentration of impurities formed by the ion injection is 1E15 to 1E17 $cm^{-3}$, and carries out heat treatment in an $N_2/O_2$ atmosphere at 1,000° C. for 60 minutes.

Furthermore, after all the SiN film has been removed, this example ion-injects B (boron) and then applies heat treatment to form a well region having a different conductivity. The concentration of impurities is similar to that in the well region.

An SiN film is again deposited using the LP-CVD process, the photolithography step is used to execute patterning to remove part of the SiN film, and a thermally oxidized film is formed using the thermal oxidization process. According to this invention, the thickness of the SiN film is 1,500 Å and the thickness of the thermally oxidized film is 8,000 Å. All the SiN film is subsequently removed and the LOCOS insulating film 2 is formed (FIG. 5A).

Next, the gate oxide film is formed using the thermal oxidization process, and impurities used to adjust thresholds are introduced using the ion injection process. According to this example, the thickness of the gate oxide film is 850 Å, and B (boron) at 4E11 $cm^{-2}$ and 40 KeV are injected under the gate oxide film as impurities.

Figure 5A:
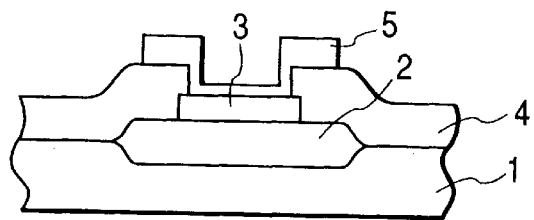
Figure 5B:
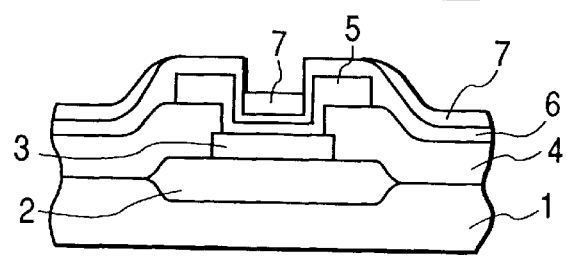
Figure 5C:
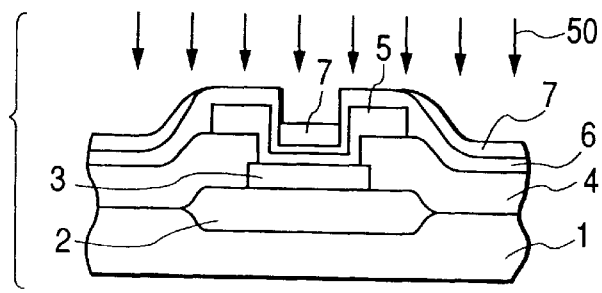
Figure 5D:
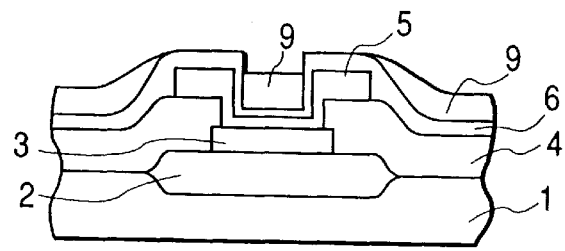
Figure 5E:
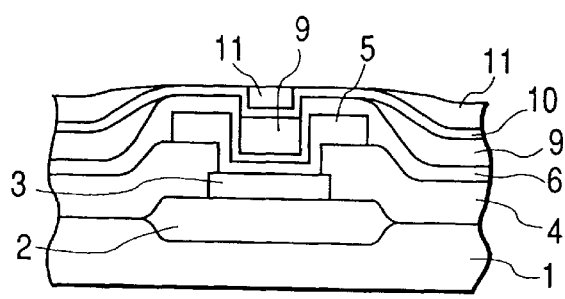
Figure 5F:
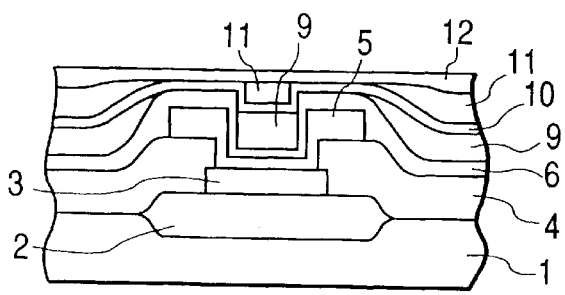

Next, polycrystal Si is deposited on the gate oxide film using the LP-CVD process, impurities are injected all over the surface, the layer is heat-treated, and the patterning process is used to form the gate electrode 3 (FIG. 5A).

This example deposits 4,400 Å of polycrystal Si, injects P (phosphorous) at 1.5E16 $cm^{-2}$ and 70 KeV, heat-treats the layer in an $N_2$ atmosphere at 950° C. for 30 minutes, and then executes patterning and etching to form the gate electrode 3.

The gate electrode 3 may comprise a combination of high-melting-point metal such as W or Co and polycrystal Si. Furthermore, to improve the voltage resistance of the gate oxide film, this example forms a 350 Å thermally oxidized film on the gate electrode 3 using the thermal oxidization process.

Next, the resist patterning process is used to open the resist around the gate electrode 3, and impurities are injected into the opening. The impurities have a conductivity opposite to that of the well region, and are subjected to heat treatment. According to this example, the well region is of a P type and is subjected to heat treatment so that the surface concentration of P (phosphorous) becomes 1 to $8E17 cm^{-3}$. This region becomes a field reduction layer to improve the voltage resistance of the MOS transistor. Furthermore, this example, B (boron) is ion-injected into an N-type well region, which is then subjected to heat treatment so that the surface concentration of B becomes $1E16$ to $1E17\ cm^{-3}$ to form a field reduction layer.

Next, the resist patterning process is used to open the resist around the gate electrode on the gate electrode 3, and N-type impurities are injected into the P-type well region. After the resist is removed, patterning is executed again to open the resist around the gate electrode on the N-type well region, and P-type impurities are injected into the N-type well region. According to this example, the N-type impurities comprise P (phosphorous) at $5E15\ cm^{-2}$ and 95 KeV, while the P-type impurities comprise $BF_2$ at $3E15\ cm^{-2}$ and 100 KeV. After the resist is removed, heat treatment is applied in an $N_2$ atmosphere at 1,000° C. for 10 minutes to diffuse the impurities in order to form a source and a drain regions in the P- and N-type well regions.

According to this example, the source and drain regions are made offset by resist patterning. The amount of offset is preferably 0.5 to 2.0 μm. To provide an offset, concentrated impurities may be introduced into side spacers provided on the respective sides of the gate electrode.

Next, an insulating film is deposited using the CVD process. Although this example deposits the BPSG film 4 using the atmospheric TEOS CVD process, a different CVD process may be used or multiple insulating films may be combined together (FIG. 5A). Subsequently, the BPSG film 4 is heat-treated in an $N_2$ atmosphere at 1,000° C. for 5 minutes for reflowing.

Next, the photolithography step is used to execute patterning and etching in order to open contact holes on the source and drain regions. After the resist is removed, the PVD process is used to deposit a metal film for wiring and electrodes. Although this example deposits barrier metal consisting of Ti and TiN, heat-treats this metal, and continuously forms an Al—Si and a TiN films thereon, materials such as Al—Si—Cu, Al—Cu, and Al—Cu—Ti may be used.

Next, the metal wiring electrode wiring 5 is formed using the photolithography step (FIG. 5A). The wiring interval is 1 μm according to this example but may be 0.5 to 5 μm.

Then, the first interlayer insulating film 6 is deposited by P-CVD. Although this example uses the P-CVD process to deposit a 1,000 Å P—SiO film, this insulating film may comprise P—SiN or P—SiON, or a film obtained by the P-TEOS process.

Then, the rotating coating process is used to coat the first inorganic SOG film 7. This example forms a 2,200 Å inorganic SOG film. Subsequently, the film is irradiated with the UV light 50 of 172 nm wavelength, and a 2,200 Å inorganic SOG film is again coated thereon to form the second inorganic SOG film 9. Similar effects on surface modification can be obtained using a UV light of 185 or 254 nm wavelength or $O_2$ plasma instead of the UV light of wavelength 172 nm.

Subsequently, the film is heat-treated at 400° C. for 30 minutes, and the P-CVD process is used to deposit the second interlayer insulating film 10. Although this example uses the P-CVD process to deposit a 2,000 Å P—SiO film, this insulating film may comprise P—SiN or P—SiON, a combination of multiple films, or a film obtained by the P-TEOS process.

Then, the rotating coating process is used again to coat the third inorganic SOG film 11. This example forms a 2,200 Å inorganic SOG film. Subsequently, the film is heat-treated at 400° C. for 30 minutes, and the P-CVD process is used to deposit the third interlayer insulating film 12. This example forms a 2,000 Å P—SiO film.

This example is characterized in that the concave created due to the contact between the gate electrode 3 and the metal wiring electrode 6 is filled with the insulating film/inorganic SOG film/insulating film/inorganic SOG film, thereby significantly improving the flatness of the surface of the interlayer insulating film so as to eliminate the needs for CMP.

Furthermore, according to this example, the insulating film between the first and second inorganic SOG films comprises a P—SiO film, and is deposited at 450° C. using $SiH_4$ and $N_2O$ in such a way that the film stress acts in the direction of compression.

Since the inorganic SOG film has a film stress acting in the tensile direction, the P—SiO film is formed between the inorganic SOG films to reduce their stress.

Figure 8A:
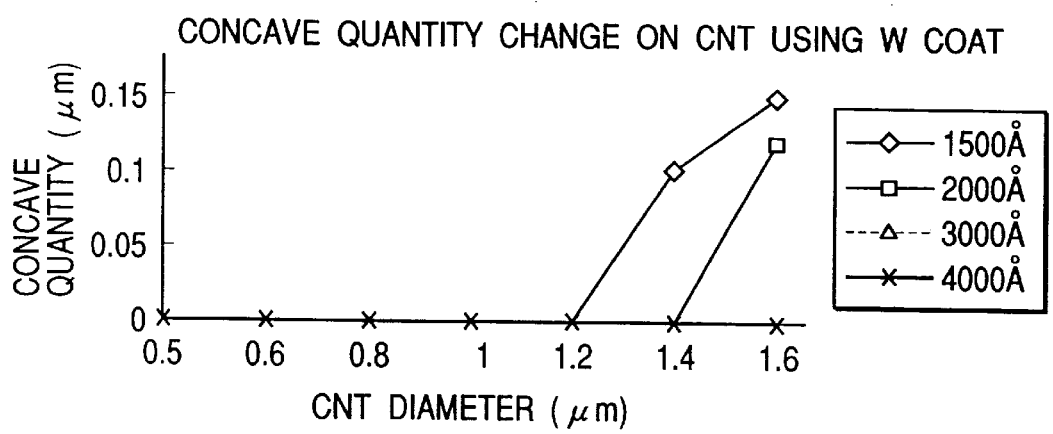
FIG. 8A is graph showing a technical verification of the capability of filling a concave on a contact hole.
Figure 8B:
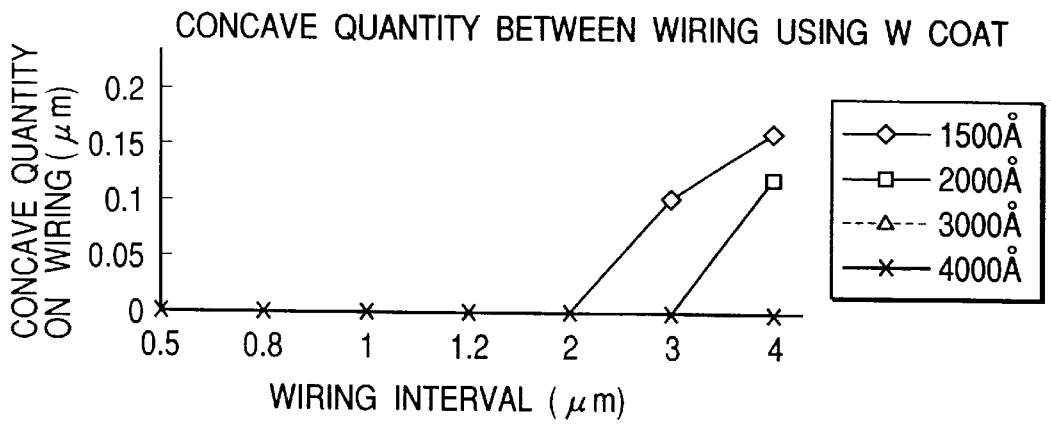
FIG. 8B is a graph showing a technical verification of the capability of filling a concave between wirings.
Figure 8C:
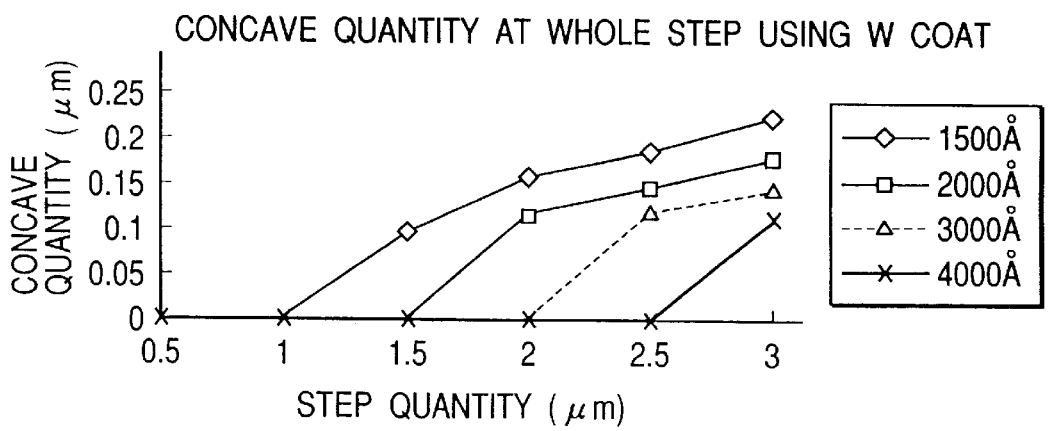
FIG. 8C is a graph showing a technical verification of the capability of filling a step on an interlayer insulating film.

With respect to the quality of the P—SiO, the magnitude or direction of the stress can be varied using the thickness of the inorganic SOG film filled over contact hole and between wirings, and the thickness can be similarly varied. FIGS. 8A, 8B and 8C show the relationship between the amount of concave created in the step and the thickness of the first, second, and third inorganic SOG films filling the concave.

The inorganic SOG film is effective in improving the flatness of the interlayer insulating film when its thickness is between 1,500 and 4,000 Å. Although this example forms the inorganic SOG film so as to be 2,200 Å in thickness, the contact opening diameter between 0.5 and 1.6 μm is effective in filling the concave, and in particular, the contact opening diameter between 0.6 and 1.2 μm serves to almost zero the amount of concave while making the surface almost perfectly flat (FIG. 8A).

In addition, between 0.5 and 3 μm, the amount of concave created due to the wiring interval is almost zero, and in particular, between 0.5 and 2 μm, the surface becomes almost perfectly flat (FIG. 8B).

Furthermore, for the amount of both the concave in the contact hole and the concave created due to the wiring interval consisting of the amount of step between the surface of the semiconductor substrate 1 and the first interlayer insulating film 7, the step quantity of 0.5 to 2.0 μm is very effective, and the step quantity between 0.5 and 1.5 μm serves to make the surface almost perfectly flat (FIG. 8C).

In the subsequent photolithography step, the dry etch process is used to open in the interlayer insulating film a through-hole required to provide conduction to the first metal wiring. Then, the PVD process is used to deposit metal for multilayer wiring, patterning and etching are executed to form a multilayer metal wiring, or the Al reflow process and then the CMP processing are executed to form a reflector (FIG. 9).

A liquid crystal panel is formed by sandwiching a liquid crystal 65 between an active matrix substrate formed in the above manner and an opposed substrate 63 on which a transparent electrode 64 is formed (FIG. 9). The liquid crystal material comprises a polymer network liquid crystal PNLC, but PDLC may be used as the polymer network liquid crystal.

This embodiment is technically effective in making the interlayer insulating film flat enough to eliminate the needs for the CMP operation during the interlayer insulating film formation step, thereby enabling reliable multilayer metal wirings and high-reflectance reflectors to be formed. As a result, highly integrated semiconductor devices and high-pixel-density display apparatuses can be formed to improve performance and yields.

Sixth Embodiment

FIGS. 12A to 12C are show configurations of an optical system in a projection liquid crystal display apparatus configured using this invention. This figure consists of FIG. 12A illustrating a top view of this optical system, FIG. 12B illustrating a front view, and FIG. 12C illustrating a side view. In this figure, 101 is a projection lens, 102 is a liquid crystal panel with a micro lens, 103 is a polarized beam splitter (PBS), 40 is an R (red light) reflecting dichroic mirror, 41 is a B/G (blue and green light) reflecting dichroic mirror, 42 is a blue (B) reflecting dichroic mirror, 43 is a high-reflectance mirror reflecting all color lights, 50 is a Fresnel lens, 51 is a convex lens, 106 is a rod integrator, 107 is an elliptical reflector, and 108 is an arc lamp such as a metal hallide or UHP.

Figure 24:
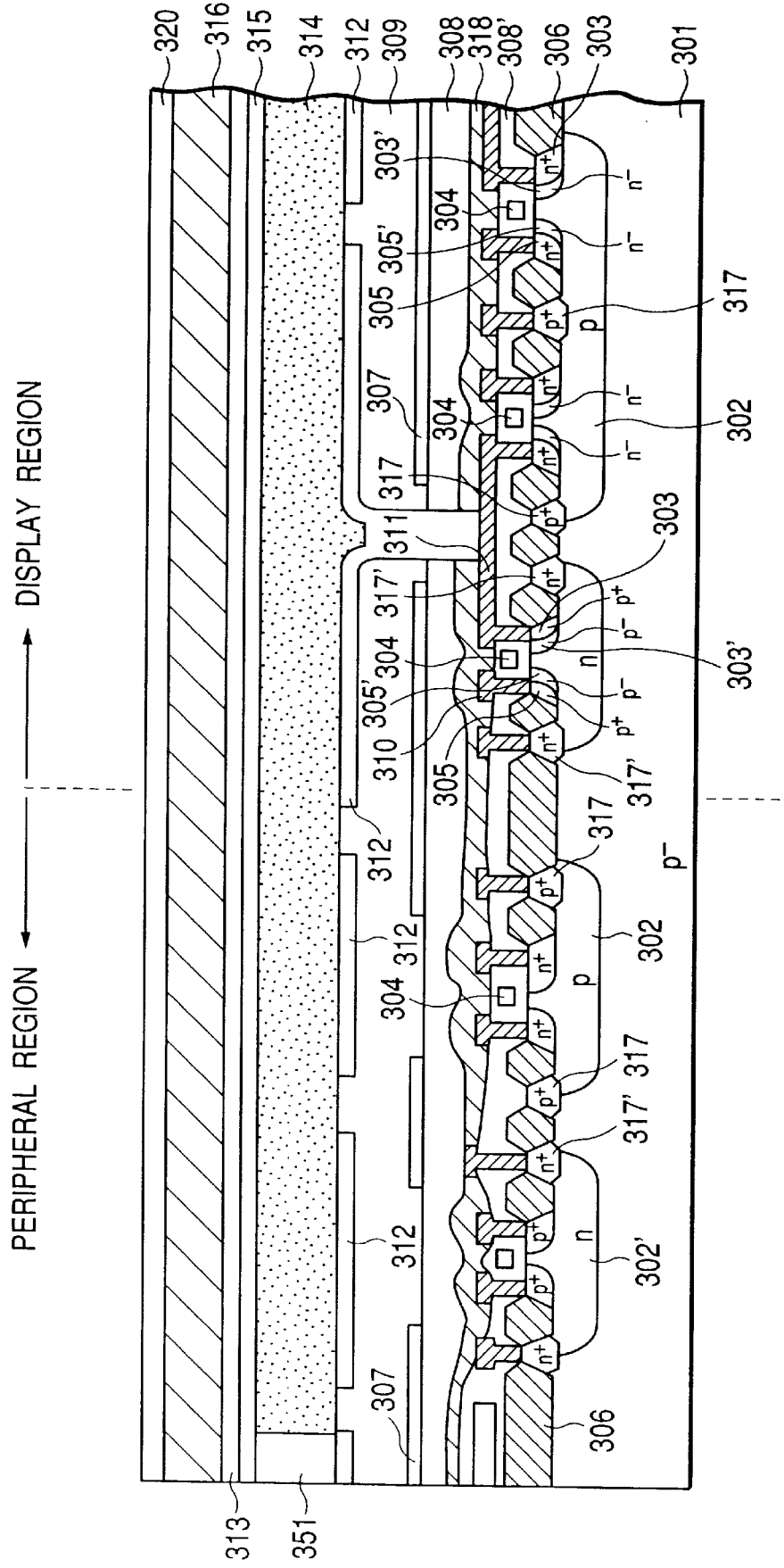
FIG. 24 is a sectional view of a liquid crystal element manufactured using CMP.

Reference numeral 104 in FIGS. 12A to 12C designate a liquid crystal panel with a micro lens, but a liquid element according to this invention has the structure shown in the sectional view in FIG. 24. Reference numeral 308 in this figure denotes an interlayer insulating film that has a sectional structure conforming to FIGS. 1A, 1B, and 1C. A method for forming an interlayer insulating film according to this invention is described with reference to this figure. A material of the metal wiring 5 is deposited and patterned to form the metal wiring 5. According to this invention, the metal wiring 5 is formed by combining Ti/TiN and Al—Si/TiN together to deposit an 8,000 Å layer. The metal wiring 5, however, may be formed by combining other wiring metal materials together.

Next, the first interlayer insulating film 6 is deposited. According to this example, 5,000 Å of a P—SiO film is deposited using the P-CVD (plasma CVD) process, but the insulating film may comprise P—SiN or TEOS or their combination (FIG. 12A).

Next, the inorganic SOG film 7 is coated all over the surface using the rotating coating method. The film must comprise inorganic SOG instead of P-containing SOG or organic SOG.

Although this example coats a 2,200 Å inorganic SOG film, this thickness may vary between 500 and 4,000 Å depending on the width or interval of metal wirings or the amount of step. If, however, the thickness is larger than 4,000 Å the stress of the film causes voids to be formed. Thus, the thickness must be 4,000 Å or smaller.

Next, the inorganic SOG film 7 is irradiated with the surface-modifying UV light 8 all over the surface. The surface-modifying UV light 8 has a wavelength of 100 to 300 nm and must be able to generate active oxygen (FIG. 12B).

This example irradiates the surface of the inorganic SOG film 7 with a 185 to 254 nm wavelength in an oxygen atmosphere for 60 seconds to generate $O_3$ and active oxygen atoms in order to modify this surface. Due to their high energy, active oxygen atoms can cut hydrogen radicals off from the top surface of the inorganic SOG film 7 that is hydrogen-terminated. It is important in this invention to use this effect to modify the surface.

In addition, a UV light of 172 nm wavelength allows active oxygen atoms to be generated more efficiently to enhance the effect of modifying the surface.

Furthermore, as a similar surface modifying process, the inorganic SOG film 7 may be irradiated with $O_2$ plasma to obtain the same surface modifying effect. To obtain effects similar to those of this example, 1-kW $O_2$ plasma is provided for 60 seconds.

An additional layer of an inorganic SOG film 9 is formed on the surface-modified inorganic SOG film 7, using the rotating coating method. Although, in this example, the thickness of the inorganic SOG film 9 is 2,200 Å, it may vary between 500 and 4,000 Å depending on the width and interval of the metal wirings and the amount of step.

This invention can significantly reduce the unevenness of the interlayer insulating film if the interval between the metal wirings is between 0.3 and 5.0 µm, and in particular, can almost perfectly flatten the surface if the interval is between 0.8 and 2.5 µm.

In addition, the concave in the first interlayer insulating film 6 on the contact hole can be filled without voids or other concaves if the amount of step is 1.5 µm or less. Particularly, the concave or step can be perfectly filled flat by forming the inorganic SOG films 7 and 9 to be 2,000 Å or more in thickness, even if the amount of step between the element separation region 11 and element formation region 12 is 1.0 µm, and if the amount of step in the concave is 1.0 µm or more.

According to this example, heat treatment at 400° C. is then applied for 30 minutes, and the second interlayer insulating film 10 is subsequently formed using the P-CVD process, as shown in FIG. 1C. The second interlayer insulating film 10 comprises a 6,000 Å P—SiO film, but the same effects can be obtained using a P—SiN or a TEOS insulating film (FIG. 12C).

Subsequently, a shading layer 307, a plasma SiN 309, and reflectors and pixel electrodes 312 are formed as shown in FIG. 24.

The R (red light) reflecting dichroic mirror 40, B/G (blue and green light) reflecting dichroic mirror 41, and blue (B) reflecting dichroic mirror 42 shown in FIGS. 12A to 12C, respectively, have the spectral reflection characteristics shown in FIGS. 13A to 13C.

These dichroic mirrors and the high-reflectance mirror 43 are three-dimensionally located as shown in the perspective view in FIGS. 12A to 12C to separate a white illumination light into RGB while illuminating the liquid crystal panel 102 in such a way that primary-color lights are incident on the liquid crystal panel from three-dimensionally different directions, as described below.

The process of the travelling of beams is explained. First, outgoing beams from the lamp 108 is white, and is collected by the elliptical reflector 107 on the inlet of the integrator 106 located in front of the reflector. The beams travel through the integrator 106 while repeating reflections, so the distribution of their spatial intensity is uniformized. The beams output from the integrator 106 are changed by the convex lens 51 and Fresnel lens 50 into parallel beams travelling in the direction of the x axis (in FIG. 12B). The beams first reach the B reflecting dichroic mirror 42, where only the B (blue) beam is reflected and travels in the negative direction of z axis, that is, downward (in FIG. 12B) at a predetermined angle from the z axis toward the R reflection dichroic mirror 40.

On the other hand, the color beams (R/G beams) other than the B beam pass through the B reflecting dichroic mirror 42 and are reflected by the high-reflectance mirror 43 perpendicularly in the negative direction of the z axis (downward) and also travel toward the R reflecting dichroic mirror 40. In FIG. 12A, the B reflecting dichroic mirror 42 and the high reflectance mirror 43 are both located to reflect beams from the integrator 106 (the negative direction of the x axis) in the negative direction of the z axis (downward). The high-reflectance mirror 43 has a rotation axis in the direction of the y axis and is inclined exactly at 45° from the xy plane, while the B reflecting dichroic mirror 42 has a rotation axis in the direction of the y axis and is inclined at an angle smaller than 45° from the xy plane. Thus, the R/G beams reflected by the high-reflectance mirror 43 are reflected perpendicularly in the negative direction of the z axis, whereas the B beams reflected by the B reflecting dichroic mirror 42 are directed downward at a predetermined angle from the z axis (a tilt within the xz plane). To match the illumination ranges on the liquid crystal panel 102 of the B and R/G beams, the amounts of the shift and tilt of the high-reflectance mirror 43 and B reflecting dichroic mirror 42 are selected so that each of the principal rays of the color beams cross one another on the liquid crystal panel 102.

Next, the R/G/B beams directed downward (the negative direction of the z axis) as described above travel toward the R reflecting dichroic mirror 40 and the B/G reflecting dichroic mirror 41. These mirrors are located below the B reflecting dichroic mirror 42 and the high-reflectance mirror 43, and the B/G reflecting dichroic mirror 41 has a rotation axis in the direction of the x axis and is inclined at 45° from the xy plane, while the R reflecting dichroic mirror 40 has a rotation axis in the direction of the x axis and is inclined at an angle smaller than 45° from the xz plane. Thus, of the R/G/B beams incident on these mirrors, the B/G beams pass through the R reflecting dichroic mirror 40 and are reflected by the B/G reflecting dichroic mirror 41 perpendicularly in the positive direction of the y axis, are polarized through the PBS 103, and then illuminate the liquid crystal panel 102 located horizontally on the xz plane. Since the B beams travel at the predetermined angle (the tilt within the xz plane) from the x axis as described above (see FIGS. 12A and 12B), they maintain a predetermined angle (a tilt within the xy plane) from the y axis after reflection from the B/G reflecting dichroic mirror 41 and illuminate the liquid crystal panel 102 using this angle as an incident angle (the direction of the xy plane). The G beams are reflected perpendicularly by the B/G reflecting dichroic mirror 41 and travel in the positive direction of the y axis. The beams are then polarized through the PBS 103 and illuminates the liquid panel 102 at an incident angle of 0°, that is, perpendicularly. The R beams are reflected in the positive direction of the y axis by the R reflecting dichroic mirror 40 located in front of the B/G reflecting dichroic mirror 41 as described above. Then, as shown in FIG. 12C (side view), the beams travel in the positive direction of the y axis at a predetermined angle from the y axis (a tilt within the yz plane), are polarized through the PBS 103, and then illuminate the liquid crystal panel 102 using as an incident angle (the direction of the yz plane) the predetermined angle relative to the y axis.

As described above, to match the illumination ranges on the liquid crystal panel 102 of the RBG color beams, the amounts of the shift and tilt of the B/G reflecting dichroic mirror 41 and R reflecting dichroic mirror 40 are selected so that each of the principal rays of the color beams cross one another on the liquid crystal panel 102.

Furthermore, as shown in FIGS. 13A to 13C, the cut wavelengths of the B/G and R reflecting dichroic mirrors 41 and 40 are 570 nm and 600 nm, respectively, so the unwanted orange beams are transmitted through the B/G reflecting dichroic mirror 41 and are deserted, thereby providing an optimal color balance.

Then, as described below, the RGB beams are modulated, that is, reflected and polarized by the liquid crystal panel 102 and then return to the PBS 103. Beams reflected by a PBS surface 103a in the positive direction of the x axis become image beams and are enlarged and projected on a screen (not shown) through the projection lens 101.

Since the RGB beams, which illuminate the liquid crystal panel 102, have different incident angles, RGB beams reflected from the panel also have different outgoing angles, and the projection lens 101 have a lens diameter and an aperture both large enough to capture all these beams. The inclinations of beams incident on the projection lens 101 are made parallel because each color beam passes through the micro lens twice, thereby maintaining the inclination of the light incident on the liquid crystal panel 102.

According to this example, the spread of beams from the liquid crystal panel 102 is relatively small, so even a projection lens of a smaller numerical aperture can provide a sufficiently bright projected image on the screen, thereby enabling the use of a more inexpensive projection lens.

Figure 15:
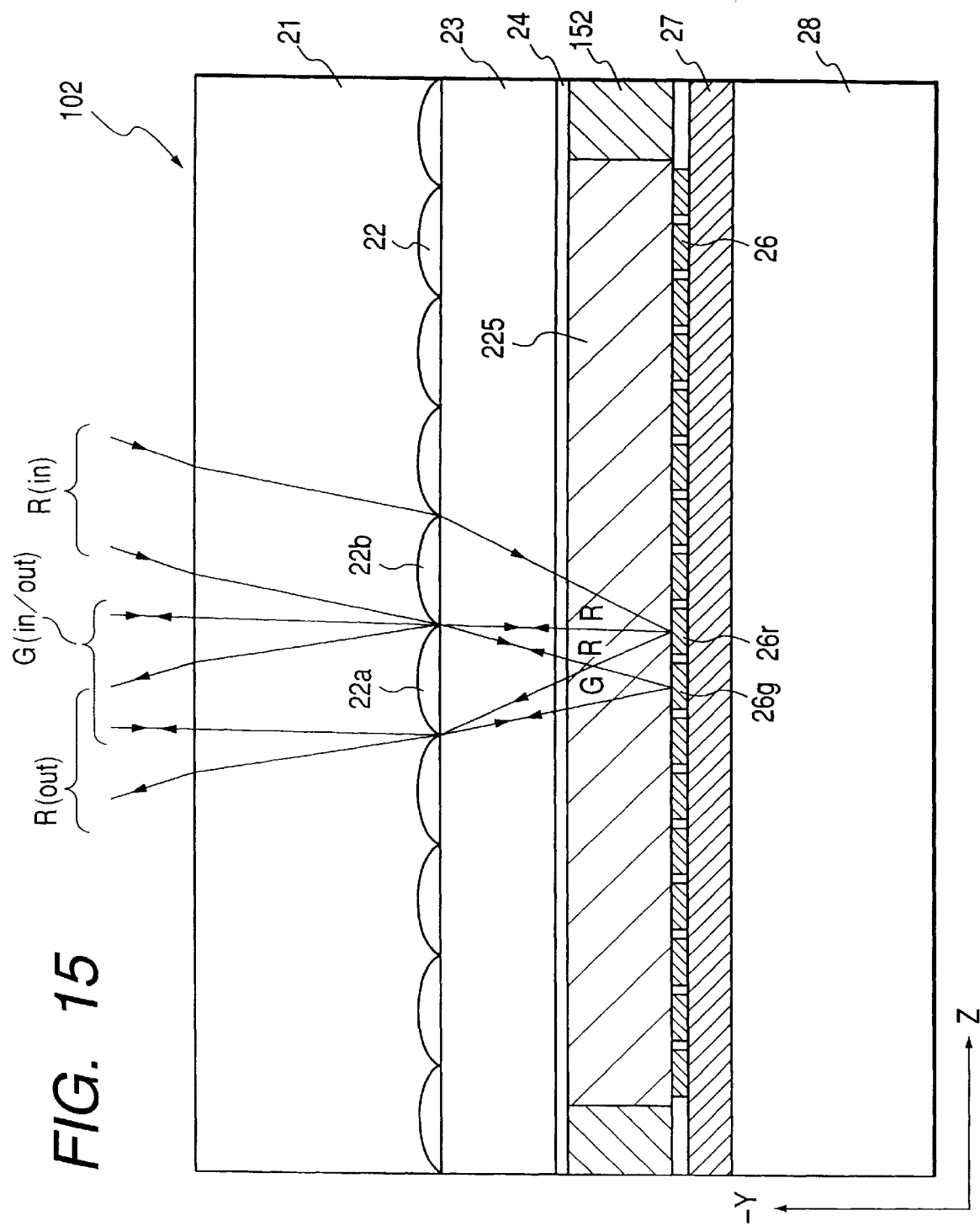
FIG. 15 is a sectional view showing an example of a liquid crystal panel according to this invention.

Next, the liquid crystal panel 102 used in this example is explained. FIG. 15 shows an enlarged sectional image drawing (corresponding to the yz plane in FIGS. 12A to 12C) of the liquid crystal panel 102. In this figure, 21 is a micro lens substrate, 22 is a micro lens, 23 is a sheet glass, 24 is a transparent opposite electrode, 25 is a liquid crystal layer, 26 is a pixel electrode, 27 is an active matrix drive circuit section, and 28 is a silicon semiconductor substrate.

The micro lens 22 is formed on the surface of the glass substrate (an alkali glass) 21 using so called the ion exchange process, and constitutes a two-dimensional array structure the pitch of which is double that of the pixel electrodes 26. The liquid crystal layer 25 comprises an ECB-mode nematic liquid crystal such as DAP or HAN which is compatible with the reflection type, and maintains a predetermined orientation due to its oriented layer (not shown). The pixel electrodes 26 consist of Al, also act as a reflector, and has been subjected to CMP processing during the final step after patterning to improve the surface characteristics and reflectance. The active matrix drive circuit section 27 is a semiconductor circuit that is provided on the silicon semiconductor substrate 28 and that active-matrix-drives the pixel electrodes 26. A gate line driver (a vertical register) (not shown) or a signal line driver (a horizontal register) is provided around the circuit matrix (described below in detail). These peripheral drivers and the active matrix drive circuit are configured to write RGB primary video signals to predetermined RGB pixels. Although the pixel electrodes 26 have no color filter, they are each identified as one of the RGB pixels by a primary video signal written by the active matrix drive circuit and form a predetermined RGB pixel arrangement described below.

The G beams, which illuminate the liquid crystal panel 102, are polarized by the PBS 103 and are incident on the liquid crystal panel 102 perpendicularly. An example of one of these beams incident on the micro lens 22a is shown by the arrow (in/out) in the figure. As shown in the figure, the G beam is collected by the micro lens 22*a* to illuminate a G pixel electrode 26*g*. The beam is reflected by the pixel electrode 26*g* consisting of Al, and passes through the micro lens 22*a* again and to the exterior of the panel. Upon passing through the liquid crystal layer 25 during the round trip, the G beam (the polarized beam) is modularized by the motion of the liquid crystal caused by electric fields formed between the pixel electrode 26*g* and the opposite electrode 24 by a signal voltage applied to the electrode 26*g*, then leaves the liquid crystal panel, and then returns to the PBS 103. The level of modulation determines the quantity of light reflected by the PBS surface 103*a* and directed to the projection lens 101, thereby enabling the variable-density graded display of each pixel.

An R beam is described that is incident from the diagonal direction in the cross section (the yz surface) in the figure as described above. After being polarized by the PBS 103 as described above by the arrow R (in), the R beam is incident on, for example, the micro lens 22*b* and is collected by this lens to illuminate the R pixel electrode 26*r* located to the left of the position immediately under the lens 22*b*. The beam is then reflected by the pixel electrode 26*r*, and passes through the adjacent (the negative z direction) micro lens 22*a* to the exterior of the panel (R(out)). In this case the R beam (the polarized beam) is also modularized by the motion of the liquid crystal caused by electric fields formed between the pixel electrode 26*r* and the opposite electrode 24 by a signal voltage applied to the electrode 26*r*, then leaves the liquid crystal panel, and then returns to the PBS 103. The beam is subsequently projected as part of the image light in exactly the same manner as in the G beam described above.

Although FIG. 15 shows that the G and R beams partly overlap and interfere with each other on the pixel electrodes 26*g* and 26*r*, the thickness of the liquid crystal layer is enlarged and exaggerated, and is actually 5 μm or less, which is much smaller than the thickness of the sheet glass 23, that is, 50 to 100 μm. Consequently, such interference does not occur regardless of the size of the pixel.

Figure 16A:
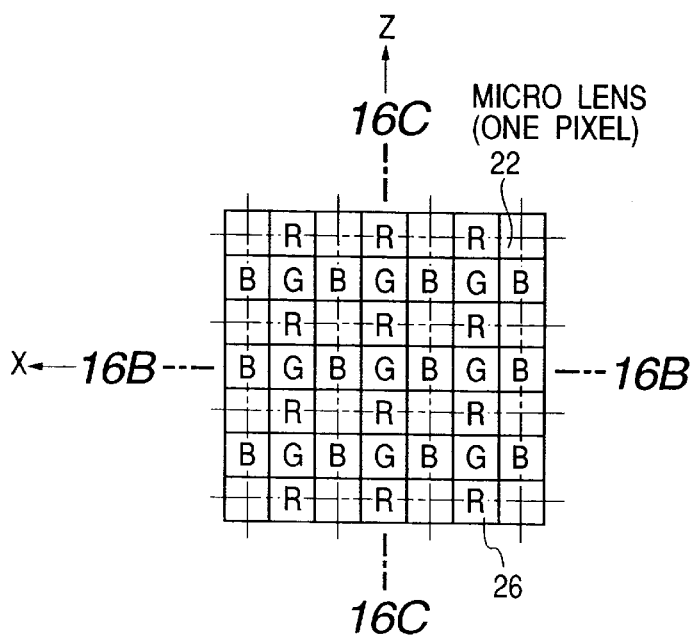
FIGS. 16A, 16B and 16C are explanatory drawings for the principle of color separation and synthesis in the liquid crystal panel according to this invention.
Figure 16C:
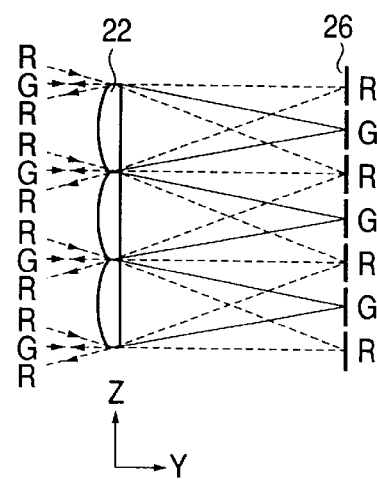
Figure 16B:
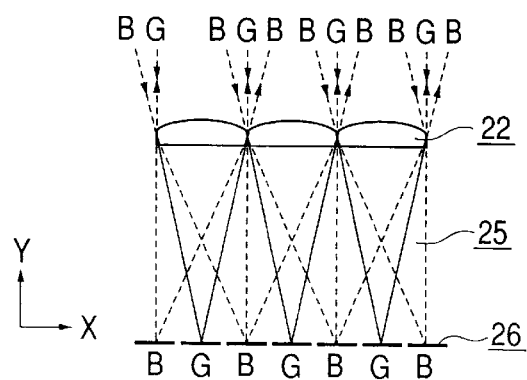

FIGS. 16A to 16C show explanatory drawings of the principle of color separation and synthesis according to this example. FIG. 16A is an image drawing of the top surface of the liquid crystal panel 102, and FIGS. 16B and 16C are image drawings of the cross sections taken along line 16B—16B (x direction) and 16C—16C (z direction) in FIG. 16A. FIG. 16C corresponds to FIG. 15 illustrating the yz cross section and shows the incoming and outgoing of a G and an R beam incident on the micro lens 22. As is apparent from this figure, each G pixel electrode is located directly under the center of the micro lens, and each R pixel electrode is located directly under the boundary between the micro lenses. Thus, the incident angle tan θ of the R beam is preferably set equal to the ratio of the pixel pitch (B and R pixels) to the distance between the micro lens and the pixel electrodes.

FIG. 16B corresponds to the xy cross section of the liquid crystal panel 102. B and G pixel electrodes are alternately located in the xy cross section as in FIG. 16C, and each G pixel electrode is located directly under the center of the micro lens, while each B pixel electrode is located directly under the boundary between the micro lenses. The B beam, which illuminates the liquid crystal panel, is polarized by the PBS 103 as described above and is then incident from the diagonal direction in the cross section (the xy plane) in the figure. Accordingly, as in the R beam, the B beam incident through each micro lens is reflected by the B pixel electrode and leaves the micro lens adjacent in the x direction to the micro lens on which this B beam has been incident, as shown in the figure. The modulation on the B pixel electrode effected by the liquid crystal and the projection of the B outgoing beam from the liquid crystal panel are similar to those described for the G and R beams. In addition, each B pixel electrode is located directly under the boundary between the micro lenses and its incident angle tan θ on the liquid crystal panel of the B beam is preferably set equal to the ratio of the pixel pitch (G and B pixels) to the distance between the micro lens and the pixel electrodes, as in the R beam. In this liquid crystal panel, the RGB pixels are arranged in the order of RGRGRG . . . in the z direction and in the order of BGBGBG . . . in the x direction, and FIG. 16A shows this arrangement in a top view. The size of each pixel is almost half that of the micro lens in both length and width, and the pitch of the pixels is also half that of the micro lens in both x and z directions. In addition, the G pixel is located directly under the center of the micro lens in a top view, the R pixel is located between the G pixels and on the boundary between the micro lenses in the z direction, and the B pixel is located between the G pixels and on the boundary between the micro lenses in the x direction. One micro lens is shaped like a rectangle (twice as large as the pixel).

Figure 17:
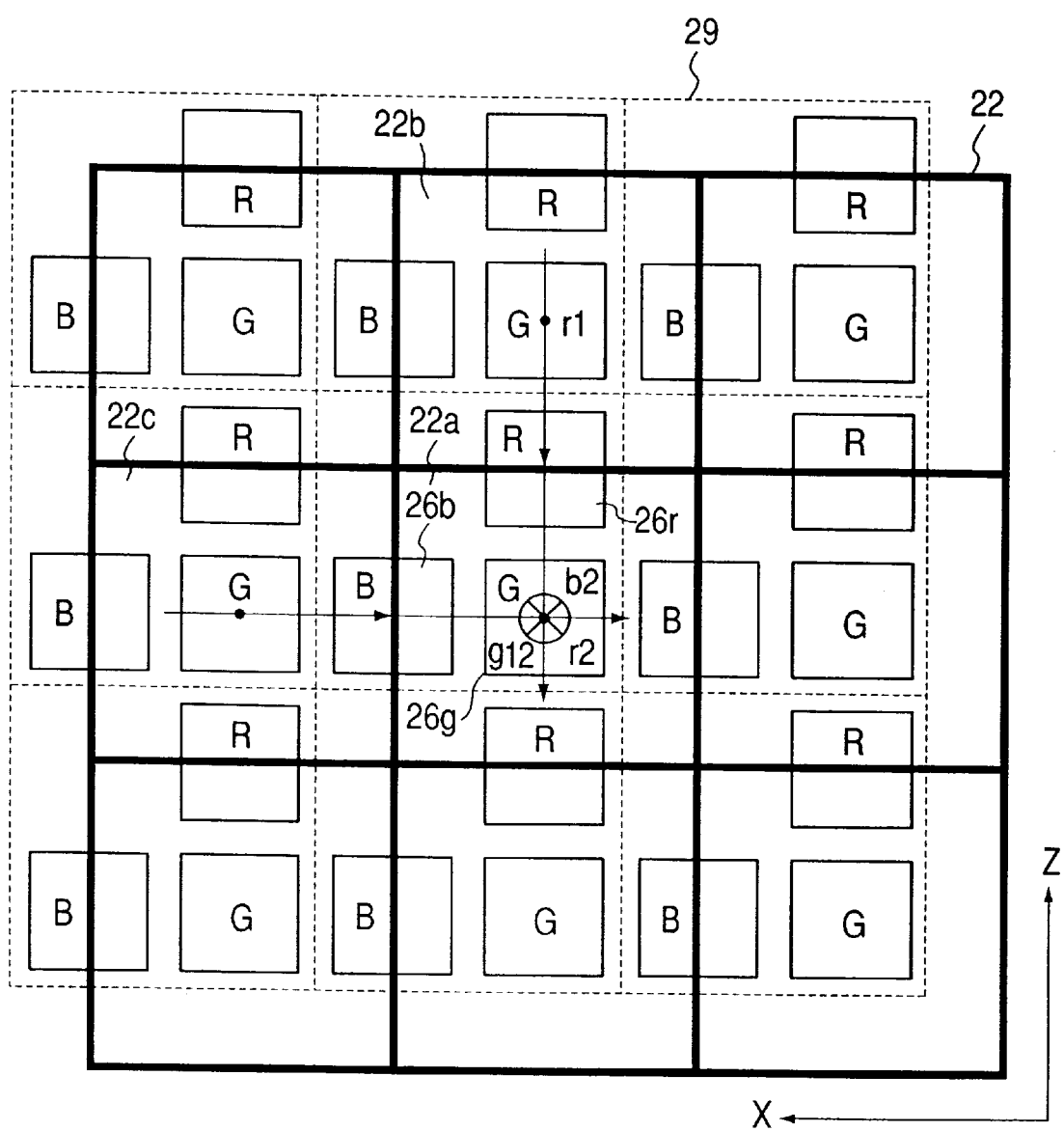
FIG. 17 is a partially enlarged top view of an example of a liquid crystal panel according to this invention.
Figure 18:
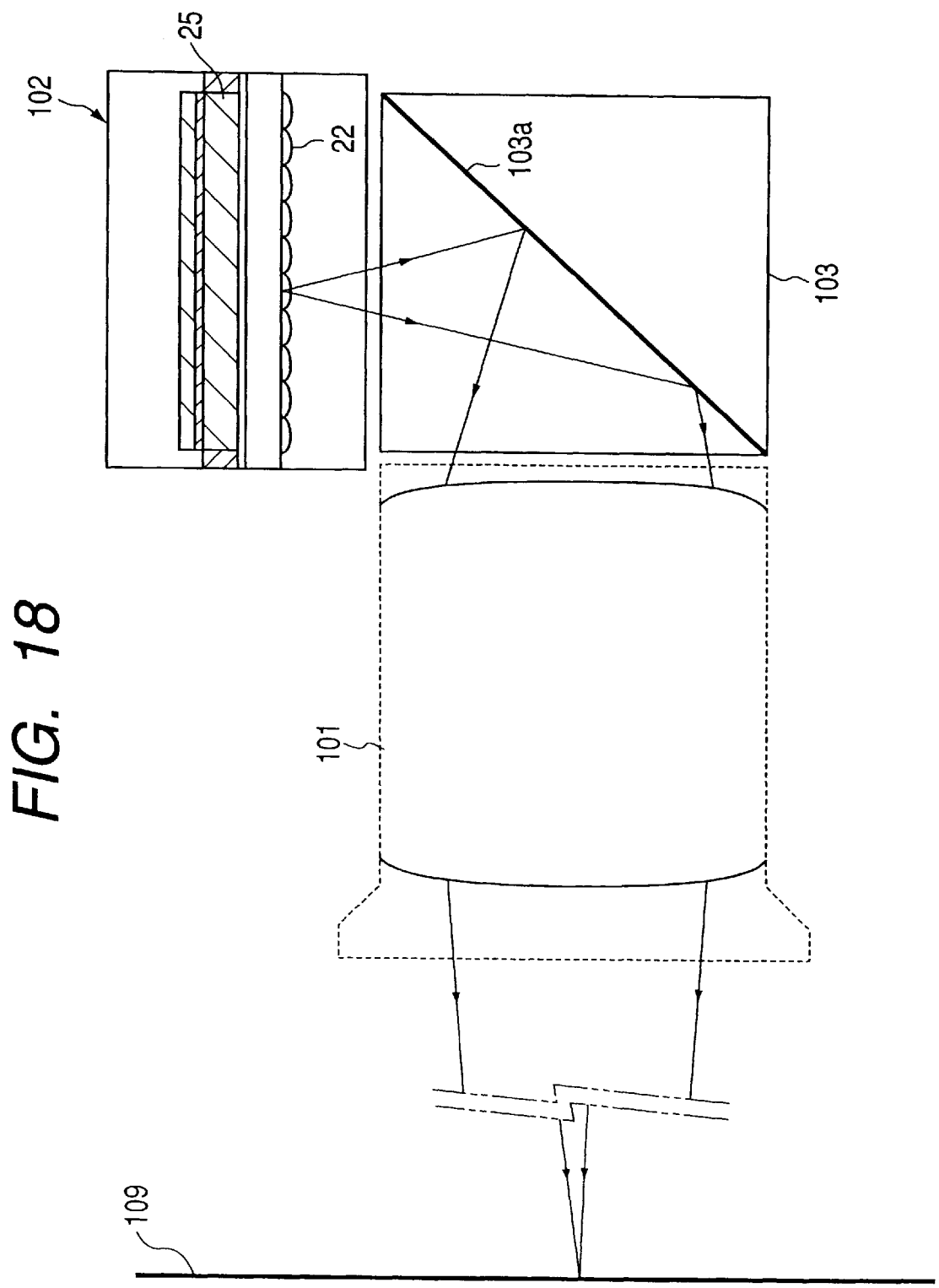
FIG. 18 is an image drawing showing a projecting optical system in the projection display apparatus according to this invention.

FIG. 17 shows a partly enlarged top view of this liquid crystal panel. The grid 29 shown by the dashed line in the figure shows a unit of RGB pixels constituting one picture element. That is, when the active matrix drive circuit 27 in FIG. 15 drives each of the RGB pixels, the RGB pixel unit shown by the grid 29 shown by the dashed line is driven by an RGB video signal corresponding to the position of this unit. The one picture element constituting of the R, G, and B pixel electrodes 26*r*, 26*g*, and 26*b* is described below. The R pixel electrode 26*r* is illuminated by the R beam incident diagonally through the micro lens 22*b* as shown by the arrow r1 and as described above, and the R reflected beam is output through the micro lens 22*a* as shown by the arrow r2. The B pixel electrode 26*b* is illuminated by the B beam incident diagonally through the micro lens 22*c* as shown by the arrow b1 and as described above, and the B reflected beam is also output through the micro lens 22*a* as shown by the arrow b2. The G pixel electrode 26*g* is illuminated by the G beam incident perpendicularly (in the direction toward the sheet of the drawing) through the micro lens 22*a* as shown by the vertical arrow g12 and as described above, and the G reflected beam is output perpendicularly (the direction toward the reader) also through the micro lens 22*a*. In this liquid crystal panel, the RGB pixel unit constituting one picture element is output through the same micro lens (in this case, 22*a*) despite the difference in the incidence and illumination position of each primary illuminating beam. This applies to all the other pixels (RGB pixel units).

Figure 20:
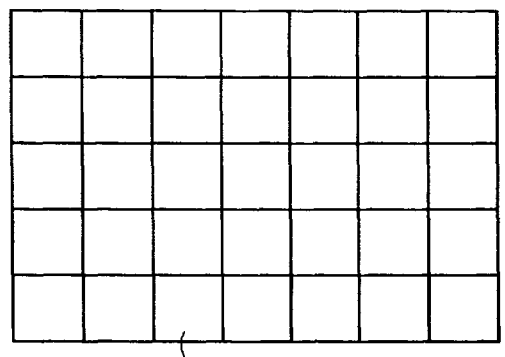
FIG. 20 is a partially enlarged view of a projected image on a screen in an example of a projection display apparatus according to this invention.

Accordingly, when all outgoing beams from this liquid crystal panel are projected on the screen 109 through PBS 103 and the projection lens 101 and if the positions of the micro lenses in the liquid crystal panel 102 are optically adjusted so as to form an image on the screen 109, the projected image comprises a mixture in the micro lens grid shown in FIG. 20, of the colors of the outgoing beams from the RGB pixel unit constituting each picture element, that is, the component unit of the image is a picture element in which the colors of the corresponding pixels are mixed. This configuration can display high-quality color images having no RGB mosaics as in the prior art.

The circuit diagram in FIG. 15 simply shows the RGB pixels in horizontal rows, but since the active matrix drive circuit section (27 in FIG. 15) is present under each pixel electrode (26 in FIG. 15), the drain of each pixel FET is connected to each RGB pixel electrode 26 in the two-dimensional arrangement shown in FIG. 17.

Figure 19:
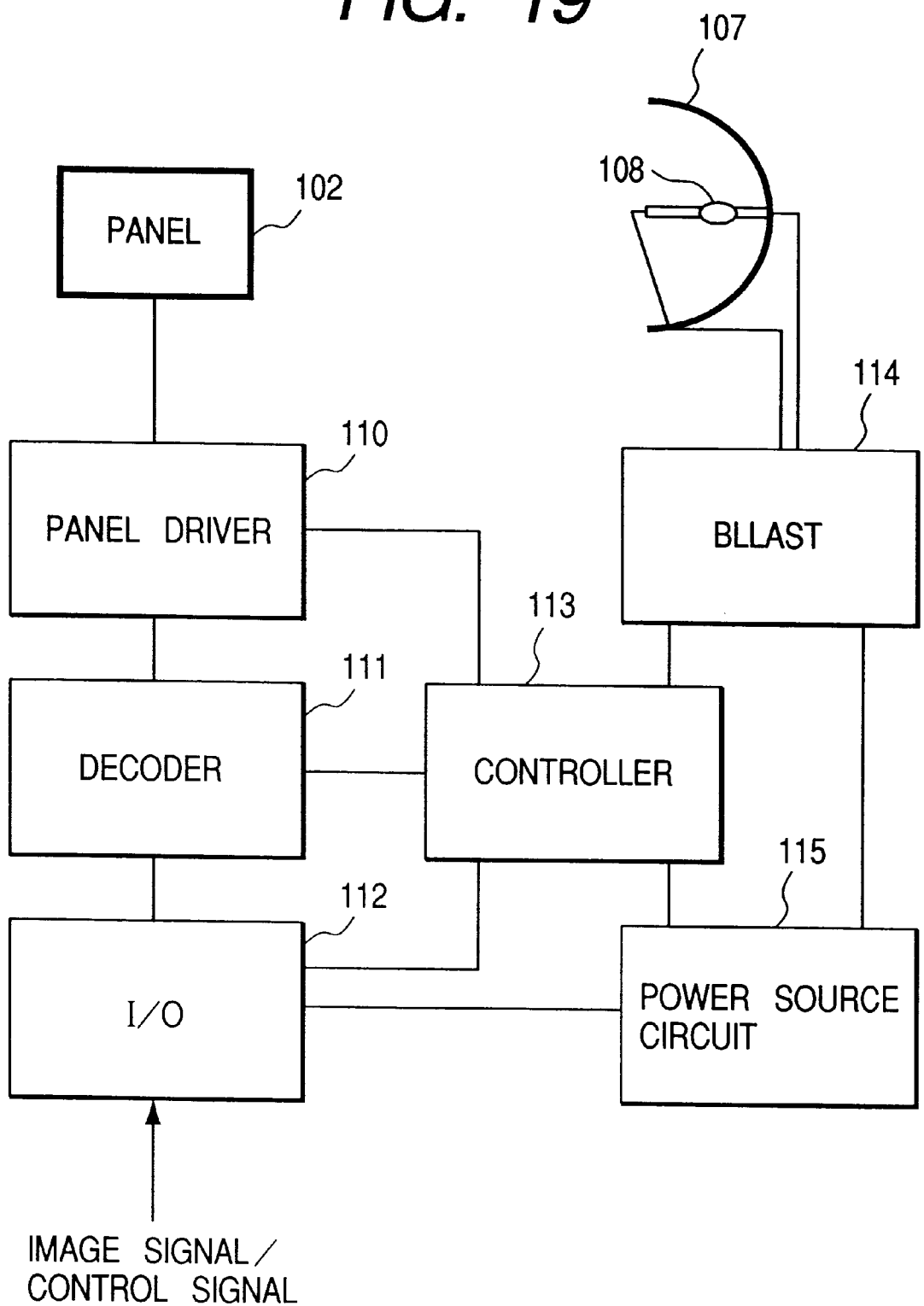
FIG. 19 is a block diagram showing a drive circuit system in the projection display apparatus according to this invention.

FIG. 19 shows a general block diagram of a drive circuit system in this projection liquid crystal display apparatus. Reference numeral 110 designates a panel driver that inverts the polarity of an RGB video signal, that forms a liquid-crystal drive signal by means of a predetermined voltage amplification, and that forms an opposite-electrode-24 drive signal and various timing signals. Reference numeral 112 denotes an interface that decodes various video and control transmit signals into standard video signals. Reference numeral 111 is a decoder that decodes a standard video signal into an RGB primary image signal and a synchronization signal. Reference numeral 114 is a ballast that drives and lights the arc lamp 108. Reference numeral 115 indicates a power source circuit that supplies power to each circuit block. Reference numeral 113 designates a controller including an operation section (not shown) that generally controls each circuit block. Thus, the drive circuit system of this projection liquid crystal display apparatus is very general as a single-plate projector, and can display high-quality color images without RGB mosaics as described above.

Figure 21:
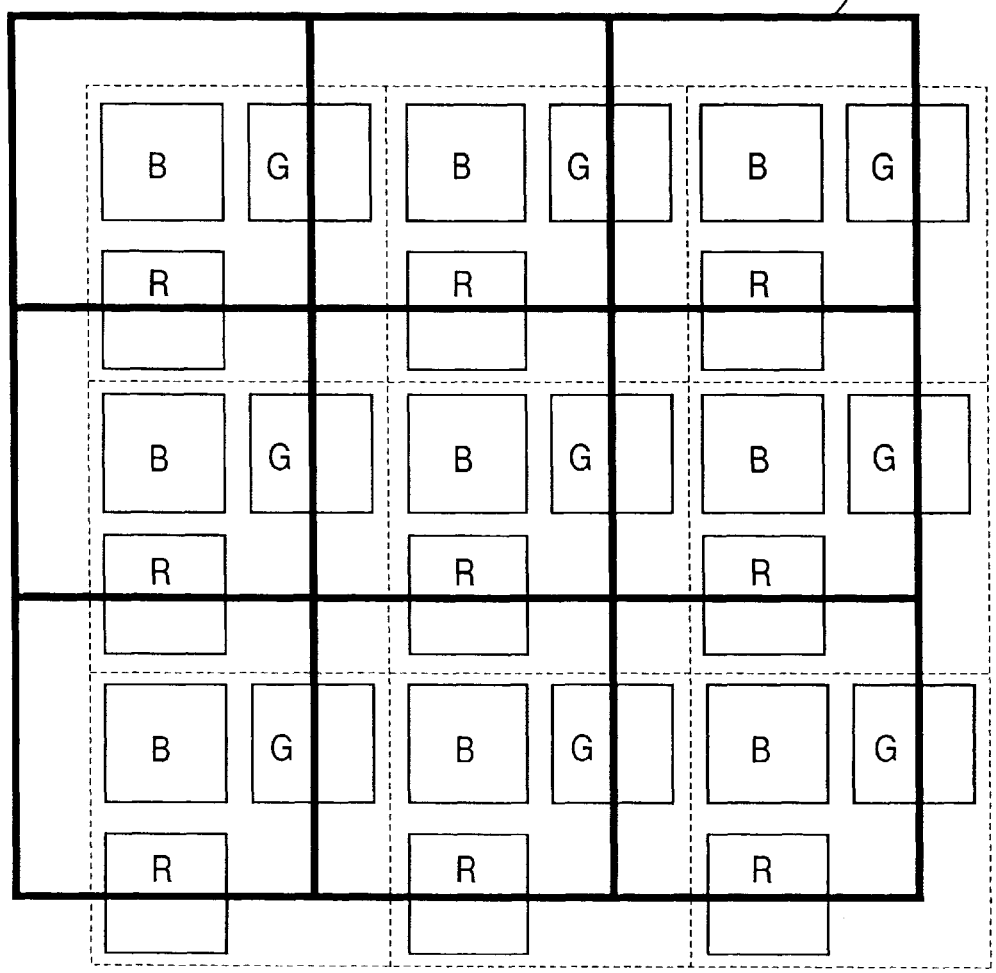
FIG. 21 is a partially enlarged top view of an example of a liquid crystal panel according to this invention.

FIG. 21 shows a partly enlarged top view of another form of a liquid crystal panel according to this invention. The B pixel is arranged directly below the center of the micro lens 22, with the G pixels placed on both sides of the B pixel in the lateral direction and R pixels placed on both sides of the B pixel in the vertical direction. In this arrangement, exactly the same effects can be obtained if the B beam is perpendicularly incident while the R/G beams are diagonally incident (the same angle but a different direction) so that beams reflected from the RGB pixel unit constituting a picture element are output through one common micro lens. The R pixel may be arranged directly below the center of the micro lens 22, with the other pixels placed on both sides of the B pixel in the lateral or vertical direction. The display apparatus shown in this example can also be configured using the approaches shown in the third to fifth embodiments.

Seventh Embodiment

Figure 22:
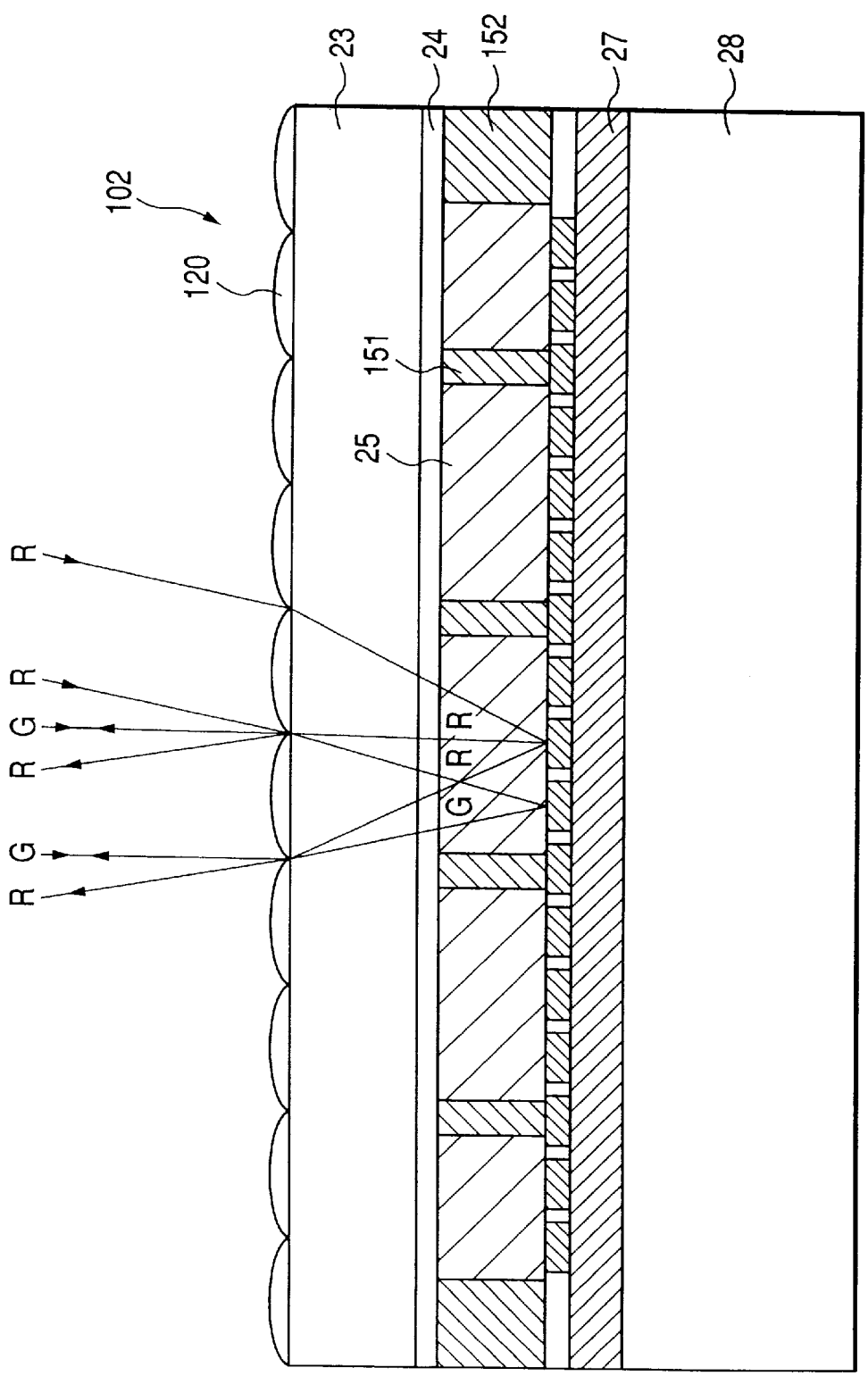
FIG. 22 is an image drawing showing an example of a liquid crystal panel according to this invention.

This embodiment is described with reference to FIG. 22.

In this figure, 27 is an active matrix drive circuit. FIGS. 1A, 1B, and 1C show sectional structures of an interlayer insulating film formed in the active matrix drive circuit 27 according to this invention. Reference numeral 308' denotes a BPSG (Boron-Phosphor-Silicate-Glass).

A method for forming an interlayer insulating film according to this invention is described with reference to this figure. A material of the metal wiring 5 is deposited and patterned to form the metal wiring 5. According to this invention, the metal wiring 5 is formed by combining Ti/TiN and Al—Si/TiN together to deposit an 8,000 Å layer. The metal wiring 5, however, may be formed by combining other wiring metal materials together.

Next, the first interlayer insulating film 6 is deposited. According to this example, 5,000 Å of a P—SiO film is deposited using the P-CVD process, but the insulating film may comprise P—SiN or TEOS or their combination.

Next, the inorganic SOG film 7 is coated all over the surface using the rotating coating method. The film must comprise inorganic SOG instead of P-containing SOG or organic SOG.

Although this example coats a 2,200 Å inorganic SOG film, this thickness may vary between 500 and 4,000 Å depending on the width or interval of metal wirings or the amount of step. If, however, the thickness is larger than 4,000 Å, the stress of the film causes voids to be formed. Thus, the thickness must be 4,000 Å or smaller.

Next, the inorganic SOG film 7 is irradiated with the surface-modifying UV light 8 all over the surface. The surface-modifying UV light 8 has a wavelength of 100 to 300 nm and must be able to generate active oxygen atoms (FIG. 1B).

This example irradiates the surface of the inorganic SOG film 7 with a 185 to 254 nm wavelength UV light in an oxygen atmosphere for 60 seconds to generate $O_3$ and active oxygen atoms in order to modify this surface. Due to their high energy, active oxygen atoms can cut hydrogen radicals off from the top surface of the inorganic SOG surface 7 that is hydrogen-terminated. It is important in this invention to use this effect to modify the surface.

In addition, a UV light of 172 nm wavelength allows active oxygen atoms to be generated more efficiently to enhance the effect of modifying the surface.

Furthermore, as a similar surface modifying process, the inorganic SOG film 7 may be irradiated with $O_2$ plasma to obtain the same surface modifying effect. To obtain effects similar to those of this example, 1-kW $O_2$ plasma is provided for 60 seconds.

An additional layer of an inorganic SOG film 9 is formed on the surface-modified inorganic SOG film 7, using the rotating coating method. Although, in this example, the thickness of the inorganic SOG film 9 is 2,200 Å, it may vary between 500 and 4,000 Å depending on the width and interval of the metal wirings and the amount of step.

This invention can significantly reduce the unevenness of the interlayer insulating film if the interval between the metal wirings on the pattern is between 0.3 and 0.4 µm, and in particular, can almost perfectly flatten the surface if the interval is between 0.8 and 2.5 µm.

In addition, the concave in the first interlayer insulating film 6 on the contact hole can be filled without voids or other concaves if the amount of step is 1.5 µm or less. Particularly, the concave or step can be perfectly filled flat by forming the inorganic SOG films 7 and 9 to be 2,000 Å or more in thickness, even if the amount of step between the element separation region 11 and element formation region 12 is 1.0 µm or more, and if the amount of step in the concave is 1.0 µm or more.

According to this example, heat treatment at 400° C. is then applied for 30 minutes, and the second interlayer insulating film 10 is subsequently formed using the P-CVD process. The second interlayer insulating film 10 comprises a 6,000 Å P—SiO film, but the same effects can be obtained using a P—SiN or a TEOS insulating film (FIG. 1C).

Subsequently, a shading layer 307, a plasma SiN 309, and reflectors and pixel electrodes 312 are formed as shown in FIG. 24.

FIG. 24 is a partly enlarged sectional view of the liquid crystal panel 102. This panel differs from the preceding example in that the opposite glass substrate comprises a sheet glass 23 and in that the micro lens 120 is formed of a thermal plastic resin on the sheet glass 23 using the reflow process. Furthermore, a spacer column 151 is formed of a photosensitive resin in a non-pixel portion by means of photolithography.

Figure 23A:
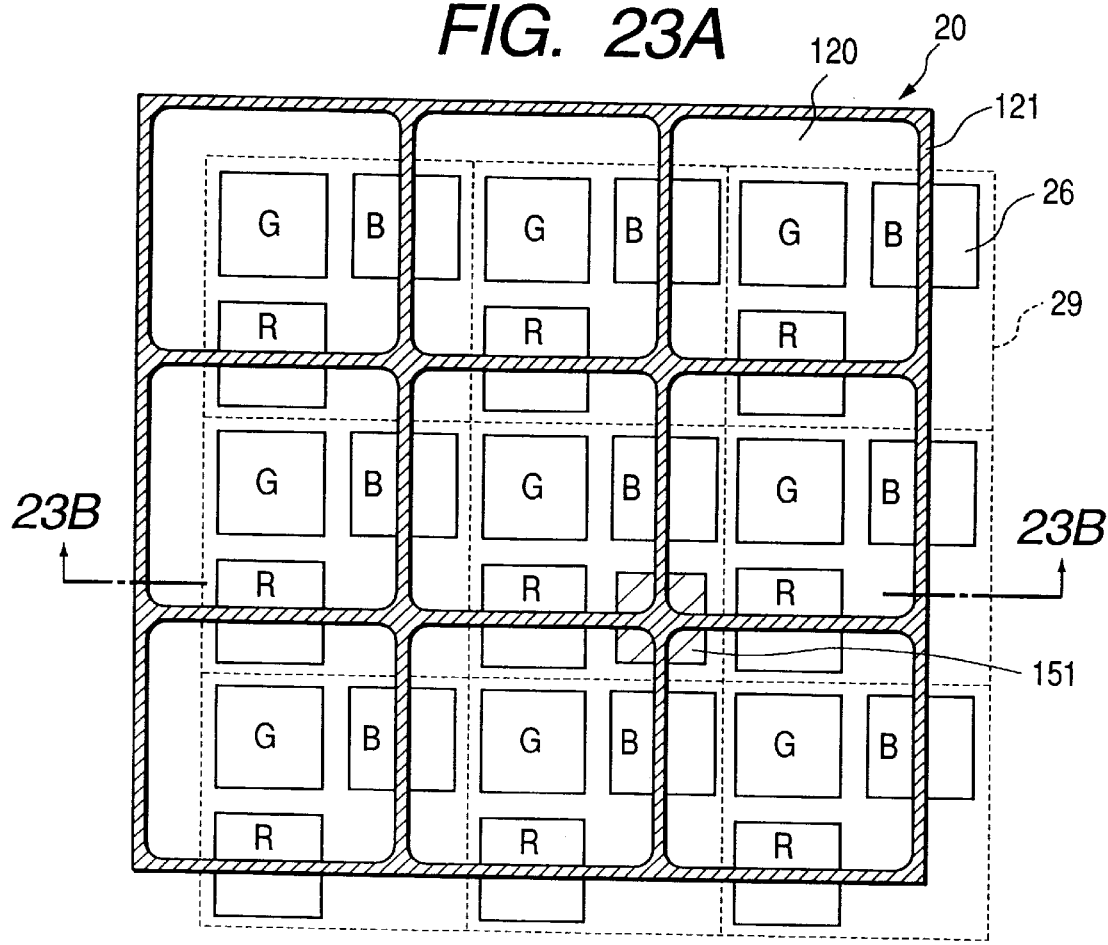
FIGS. 23A and 23B are partially enlarged top views and a partially enlarged sectional view of an example of a liquid crystal panel according to this invention.
Figure 23B:
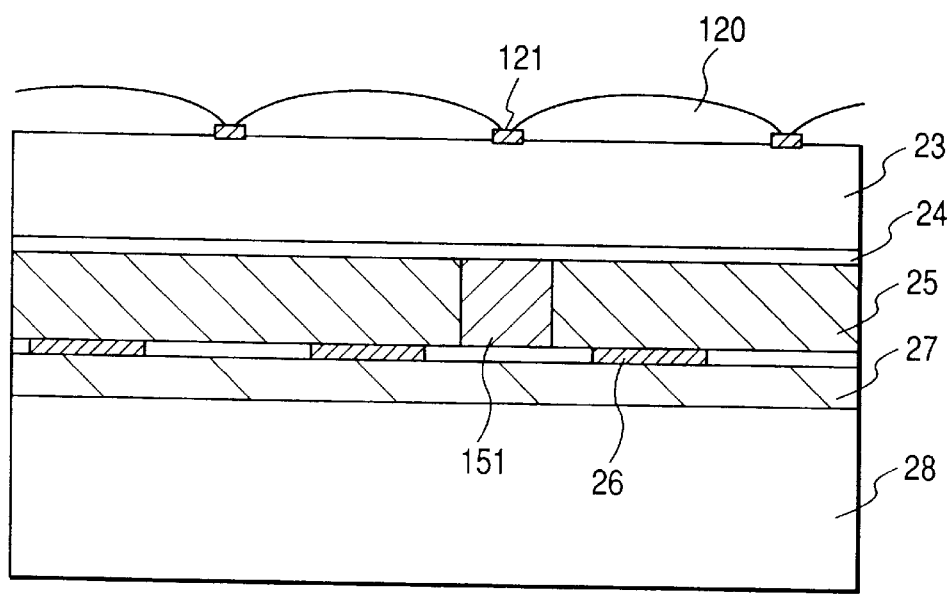

FIG. 23A shows a partly top view of the liquid crystal panel 102. As shown in this figure, each spacer column 151 is formed in the non-pixel region in a corner of the micro lens 120 at a predetermined pixel pitch. FIG. 23A shows a sectional view taken along line 23B—23B passing through the spacer columns 151. The spacer columns 151 are preferably provided in a matrix at a 10 to 100 pixel pitch, and the formation density must be set to meet the parameters of the flatness of the sheet glass 23 and the easiness with which a liquid crystal can be filled, the parameters being inconsistent with the number of spacer columns. In addition, this example provides a shading layer 121 comprising a metal-film pattern to prevent the entry of leaking light from the boundary between the micro lenses. This configuration prevents the saturation or contrast of the projected image from decreasing due to the leaking light (the saturation is reduced by the mixture of the primary image beams). Thus, excellent well-coordinated images can be obtained by configuring the projection display apparatus as in the preceding example using the liquid crystal panel 102.

In addition, in the projection liquid crystal display apparatus according to this invention, the reflected beams from the set of RGB pixels constituting one picture element are output through the same micro lens after modulation by means of the liquid crystal, using the reflecting liquid crystal panel with the micro lens and the optical system for irradiating the liquid crystal panel with the primary beams from different directions. As a result, high-quality color images without RGB mosaics can be projected and displayed.

In addition, the beams from each pixel pass through the micro lens twice so as to be made almost parallel, so bright projected images can be obtained on the screen using even an inexpensive projection lens of a small numerical aperture. The display apparatus shown in this example can be configured using the approaches shown in the third to fifth embodiments.

Eighth Embodiment

Next, a PDLC liquid crystal display apparatus is described below. This embodiment is described by referencing multiple liquid crystal panels, but these panels are not limited to the respective forms. Of course, the effects can be increased by combining the techniques of the respective forms. In addition, although the structure of the liquid crystal panel is described in conjunction with a semiconductor substrate, this invention is not necessarily limited to the semiconductor substrate but the structure described below may be formed on a normal transparent substrate. In addition, the liquid crystal panel described below comprises MOSFETs or TFTs, but may be of a two-terminal type comprising diodes. Furthermore, the liquid crystal panel described below can be effectively used in display apparatuses for not only home televisions but also projectors, head mount displays, three-dimensional video game equipment, lap top computers, electronic notebooks, television conference systems, car navigation systems, and airplane panels.

FIG. 24 shows a cross section of a liquid crystal panel section according to this invention. In this figure, 301 is a semiconductor substrate, 302 and 302' are a p- and an n-type wells, 303, 303' and 303" are source regions of a transistor, 304 is a gate region, and 305, 305' and 305" are drain regions.

As shown in FIG. 24, a high voltage of 20 to 35 V is applied to the transistors in the display region, so a source or a drain layers are not formed on the gate 304 in a self-aligned manner. Thus, an offset is provided in which a low-concentration n-layer in a (p) well and a low-concentration p-layer in an (n) well are formed as shown by a source region 303' and a drain region 305'. The amount of offset is preferably between 0.5 and 2.0 µm. FIG. 24 shows a circuit section in part of a peripheral circuit in the left, and the circuit in part of the peripheral region has a source and a drain layers formed on the gate in a self-aligned manner.

Although the offset for the source and drain has been described, not only the provision of such an offset but also the variation of the amount of offset depending on the respective voltage resistance and the optimization of the gate length are effective. Since part of the peripheral circuit is a logic circuit and can be generally driven by a voltage between 1.5 and 5 V, the self-aligned structure is used to reduce the size of the transistors and to improve their driving force. The substrate 301 consists of a p-type semiconductor to which the lowest potential (normally, the ground potential) is applied. The voltage applied to the pixels, that is, 20 to 35 V is applied to the n-type well in the display region, and a logic drive voltage between 1.5 and 5 V is applied to the logic section of the peripheral circuit. This structure can be used to configure an optimal device depending on the respective voltage, thereby reducing the size of chips and improving the drive speed to realize high-pixel display.

In FIG. 24, 306 is a filed oxide film, 310 is a source electrode connecting to a data wiring, 311 is a drain electrode connecting to a pixel electrode, 312 is the pixel electrode also acting as a reflector, and 307 is a shading layer that covers a display region and a peripheral region and for which Ti, TiN, W or Mo is suitable. As shown in this figure, the shading layer 307 covers display region except for the connection between the pixel and drain electrodes 312 and 311, but is omitted from that part of the peripheral pixel region in which the wiring capacity including video and clock lines is large. If illuminating beams enter the part from which the shading layer 307 has been omitted to cause the circuit to malfunction, the layer of the pixel electrodes 312 is covered with the shading layer to enable fast signals to be transferred. Reference numeral 308 denotes an insulating layer under the shading layer comprising SOG flattened on a P—SiO layer 318. The P—SiO layer 318 is covered with the P—SiO layer 308 to maintain the safety of the insulating layer 308.

A method for forming an interlayer insulating film according to this invention is described based on the sectional structure in FIGS. 1A to 1C. According to this example, the P—SiO layer 318 in FIG. 24 is deposited up to 5,000 Å using the plasma-CVD process, but the insulating film may comprise P—SiN or TEOS or their combination.

Next, the inorganic SOG film 7 is coated all over the surface using the rotating coating method. The film must comprise organic SOG instead of P-containing SOG or organic SOG.

Although this example coats a 2,200 Å inorganic SOG film, this thickness may vary between 500 and 4,000 Å depending on the width or interval of metal wirings or the amount of step. If, however, the thickness is larger than 4,000 Å, the stress of the film causes voids to be formed. Thus, the thickness must be 4,000 Å or smaller.

Next, the inorganic SOG film 7 is irradiated with the surface-modifying UV light 8 all over the surface. The surface-modifying UV light 8 has a wavelength of 100 to 300 nm and must be able to generate active oxygen (FIG. 1B).

This example irradiates the surface of the inorganic SOG film 7 with a UV light of 185 to 254 nm wavelength in an oxygen atmosphere for 60 seconds to generate $O_3$ and active oxygen atoms in order to modify this surface. Due to their high energy, active oxygen atoms can cut hydrogen radicals off from the top surface of the inorganic SOG film 7 that is hydrogen-terminated. It is important in this invention to use this effect to modify the surface.

In addition, irradiation of a UV light of 172 nm wavelength allows active oxygen atoms to be generated more efficiently to enhance the effect of modifying the surface.

Furthermore, as a similar surface modifying process, the inorganic SOG film 7 may be irradiated with $O_2$ plasma to obtain the same surface modifying effect. To obtain effects similar to those of this example, 1-kw $O_2$ plasma is provided for 60 seconds.

An additional layer of an inorganic SOG film 9 is formed on the surface-modified inorganic SOG film 7, using the rotating coating method. Although, in this example, the thickness of the inorganic SOG film 9 is 2,200 Å, it may vary between 500 and 4,000 Å depending on the width or interval of metal wirings or the amount of step.

This invention can significantly reduce the unevenness of the interlayer insulating film if the interval of the metal wirings is between 0.3 and 5.0 μm, and in particular, can almost perfectly flatten the surface if the interval is between 0.8 and 2.5 μm.

In addition, the concave in the first interlayer insulating film 6 on the contact hole can be filled without voids or other concaves if the amount of step is 1.5 μm or smaller. Particularly, the concave or step can be perfectly filled flat by forming the inorganic SOG films 7 and 9 to be 2,000 Å or larger in thickness, even if the amount of step between the element separation region 11 and element formation region 12 is 1.0 μm, and if the amount of step in the concave is 1.0 μm or more.

According to this invention, heat treatment at 400° C. is then applied for 30 minutes, and the second interlayer insulating film 10 is subsequently formed using the P-CVD process. The second interlayer insulating film 10 comprises a 6,000 Å P—SiO film, but the same effects can be obtained using a P—SiN or a TEOS insulating film (FIG. 1C).

Reference numeral 309 designates an insulating layer provided between the reflector 312 and the shading layer 307, and the insulating layer 309 constitutes a capacity for holding charges for the reflector 312. To form a large capacity, a laminated film comprising not only $SiO_2$ but also P—SiN, $Ta_2O_5$, or $SiO_2$ having a large dielectric constant can be effectively used. The insulating layer is preferably formed on a flat metal such as Ti, TiN, Mo, or W in the shading layer 307 so as to be between 500 and 5,000 Å in thickness.

Furthermore, 314 is a liquid crystal material, 315 is a common transparent electrode, 316 is an opposite substrate, 317 and 317' are high-concentration impurity regions, 319 is a display region, and 320 is a reflection preventing film.

As shown in FIG. 24, the high-concentration impurity layers 317 and 317' having the same polarity as the wells 302 and 302' formed under the transistor are formed around the wells 302 and 302' and inside them. Even when a signal of a high amplitude is applied to the source, the potential of the wells is fixed at a value desired for a low-resistance layer and is stable, thereby enabling high-quality images to be displayed. Furthermore, the high-concentration impurity layers 317 and 317' are provided between the n- and p-type wells 302' and 302 via the field oxide film to obviate the needs for a channel stop located directly under the field oxide film and used for MOS transistors.

The high-concentration impurity layers 317 and 317' can be simultaneously formed during the source and drain layer formation process to reduce the number of masks and steps required for the fabrication process, thereby reducing costs.

Reference numeral 313 denotes a reflection prevention film provided between the common transparent electrode 315 and the opposite substrate 316 and configured to reduce the reflectance of the liquid crystal in the interface. In this case, an insulating film is preferred that has a smaller reflectance than the opposite substrate 316 and the transparent electrode 315.

Figure 25:
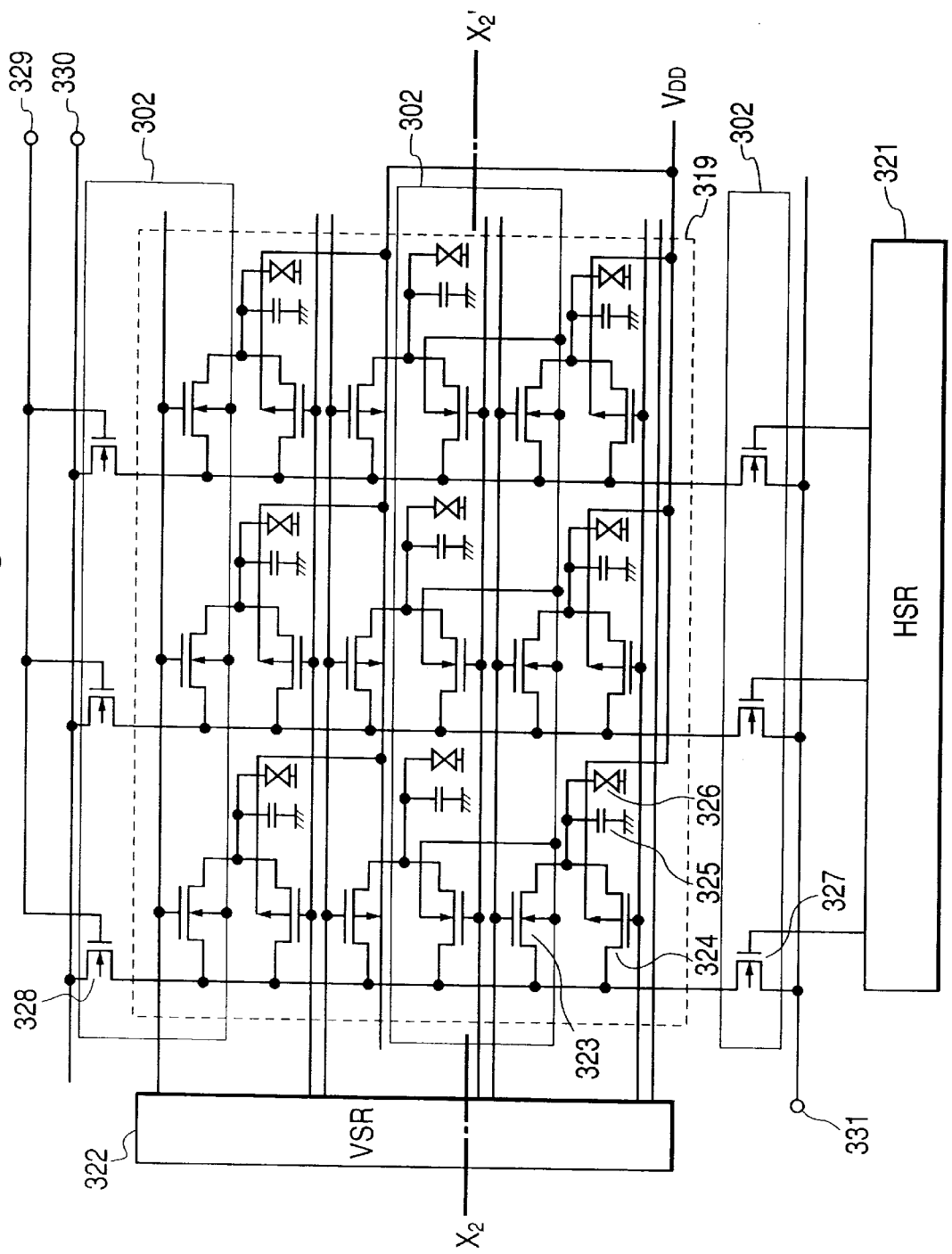
FIG. 25 is a schematic circuit diagram of a liquid crystal apparatus according to this invention.

FIG. 25 shows a top view of this invention. In this figure, 321 is a horizontal shift register, 322 is a vertical shift register, 323 is an (n) channel MOSFET, 324 is a (p) channel MOSFET, 325 is a held capacity, 326 is a liquid crystal layer, 327 is a signal transfer switch, 328 is a reset switch, 329 is a reset pulse input terminal, 330 is a reset power terminal, and 331 is a video signal input terminal. The semiconductor substrate 301 is of a (p) type in FIGS. 16A to 16C, but may be of an (n) type.

The well region 302' has a conduction type opposite to that of the semiconductor substrate 301. Thus, in FIG. 24, the well region 302 is of a (p) type. A higher concentration of impurities are preferably injected into the p- and n-type well regions 302 and 302' than into the semiconductor substrate 301. When the concentration of impurities in the semiconductor substrate 301 is between $10^{14}$ and $10^{15}$ ($cm^{-3}$), the concentration of impurities in the well region 302 is desirably between $10^{15}$ and $10^{17}$ ($cm^{-3}$).

The source electrode 310 is connected to a data wiring through which a display signal is transmitted, and the drain electrode 311 is connected to the pixel electrode 312. The electrodes 310 and 311 normally comprise an Al, AlSi, AlSiCu, AlGeCu, or AlCu wiring. A barrier metal layer consisting of Ti and TiN can be used as a contact surface between the underside of the electrode 310 or 311 and the semiconductor to provide a stable contact. This layer can also reduce the contact resistance. The pixel electrode 312 desirably comprises a flat high-reflectance material, and Cr, Au, or Ag can be used as the material in addition to Al, AlSi, AlSiCu, AlGeCu, or AlC that is a normal wiring metal. In addition, to improve flatness, the surface of the lower insulating layer 309 or the pixel electrode 312 is treated using the chemical mechanical polishing (CMP) method.

The held capacity 325 is a capacity for holding a signal between the pixel electrode 312 and the common transparent electrode 315. Substrate potential is applied to the well region 302. According to this embodiment, the transmission gates in each row are configured so that the type of the transistor alternates on a row-by-row basis in such a way that in the first row, the upper gate comprises the (n) channel MOSFET 323 while the lower gate comprises the (p) channel MOSFET 324 and that in the second row, the upper gate comprises the (p) channel MOSFET 324 while the lower gate comprises the (n) channel MOSFET 323. The striped well is not only used to provide a contact with the power lines around the display region as described above, but thin power lines are also formed in the display region to provide a contact.

In this case, it is important to stabilize the resistance of the wells. Thus, with a p-type substrate, the contact area of the (n) wells inside the display region or the number of contacts thereof is enhanced than that of the (p) wells. The p-type substrate serves to set the potential of the (p) wells at a constant value, so it acts as a low-resistance body. As a result, signals to the source and drain of the island-shaped (n) wells are notably deflected due to input or output, but this deflection can be prevented by enhancing contacts with the upper wiring layer. This configuration provides a stable high-grade display.

A video signal (a pulse-modulated digital signal and the like) is input from the video signal input terminal 331, opens or closes the signal transfer switch 327 in response to a pulse from the horizontal shift register 321, and is output to each data wiring. The vertical shift register 322 applies a high pulse to the gate of the (n) channel MOSFET 323 in the selected row, while applying a low pulse to the gate of the (p) channel MOSFET.

As described above, the switch for the pixel section is composed of monocrystal CMOS transmission gates and is advantageous in that a signal from the source can be fully written to the pixel electrode without depending on the threshold of the MOSFET.

In addition, the switch consists of monocrystal transistors and is free of the unstable behavior of polysi-TFT in grain boundaries, thereby achieving very reliable fast driving without variation.

Next, the configuration of a panel peripheral circuit is described with reference to FIG. 26. In this figure, 337 is a display region for liquid crystal elements, 332 is a level shifter circuit, 333 is a video signal sampling switch, 334 is a horizontal shift register, 335 is a video signal input terminal, and 336 is a vertical shift register.

With the configuration shown above, an amplitude of about 25 or 30 V is supplied through the video signal input terminal 335 to a logic circuit including horizontal and vertical shift registers. Consequently, the circuit can be driven with a very low voltage between 1.5 and 5 V, thereby increasing the speed while reducing the power consumption. The scanning direction for the horizontal and vertical SRs can be selected by the corresponding switch, thereby enable a change in the arrangement of the optical system to be made without changing the panel. Consequently, the same panel can be advantageously used for a series of different products to reduce costs.

Figure 26:
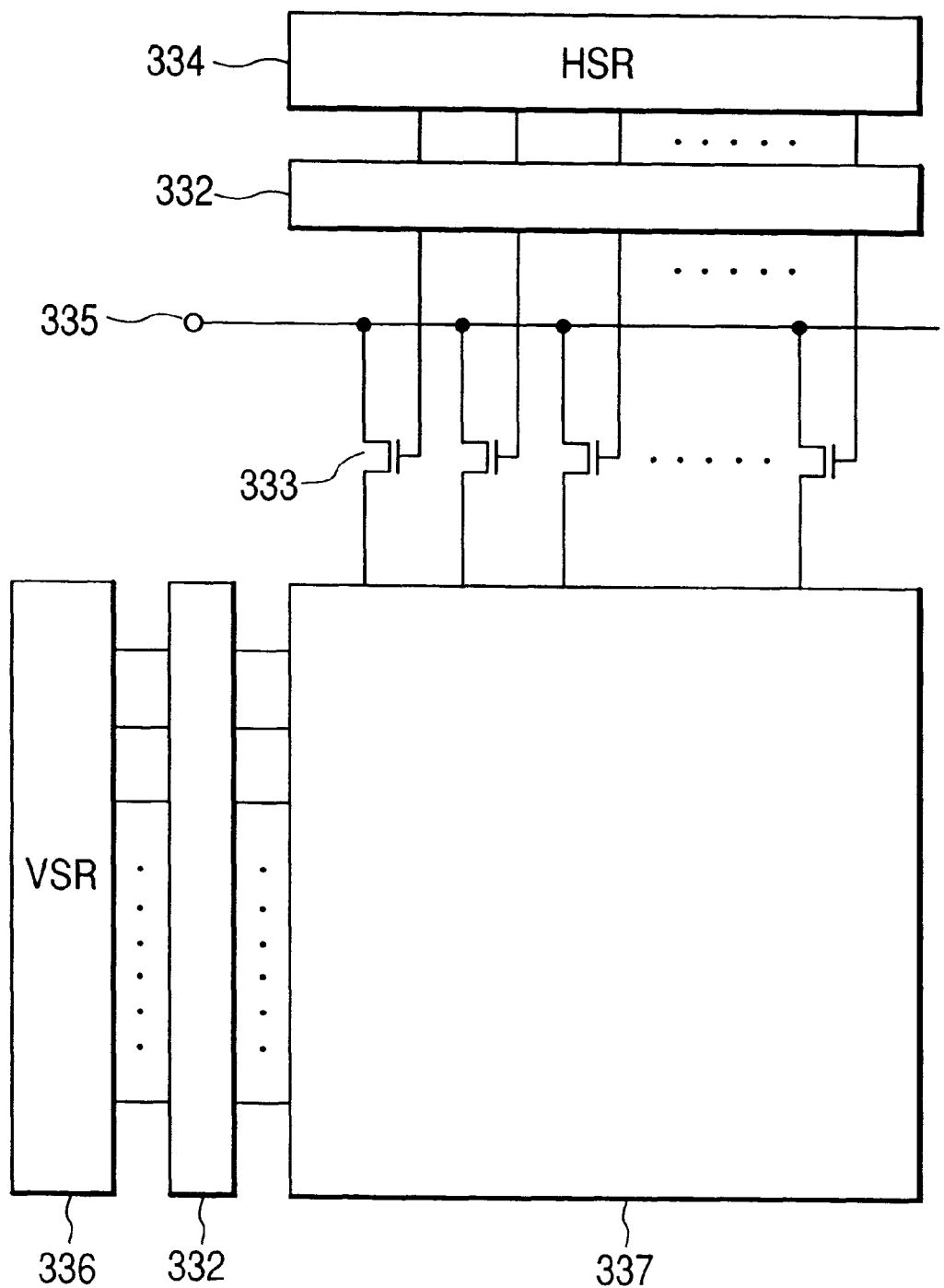
FIG. 26 is a block diagram of the liquid crystal apparatus according to this invention.

Although, in FIG. 26, the video signal sampling switch has been described as a single-transistor configuration with a single polarity, it is not limited to this form and of course, a CMOS transmission gate configuration can be used to write all input video signals to the signal line.

In addition, with the CMOS transmission gate configuration, a video signal may be deflected due to the difference in area between an NMOS gate and a PMOS gate and the difference between the overlapping capacity between the gate and source and the overlapping capacity between the gate and drain. Such deflection can be prevented by connecting the signal line to the sources and drains of MOSFETs having an amount of gate about half that of MOSFETs for a sampling switch having the respective polarities and applying voltages in opposite-phase pulses, thereby enabling very excellent video signals to be written to the signal line. This configuration further improves the grade of display.

Figure 27:
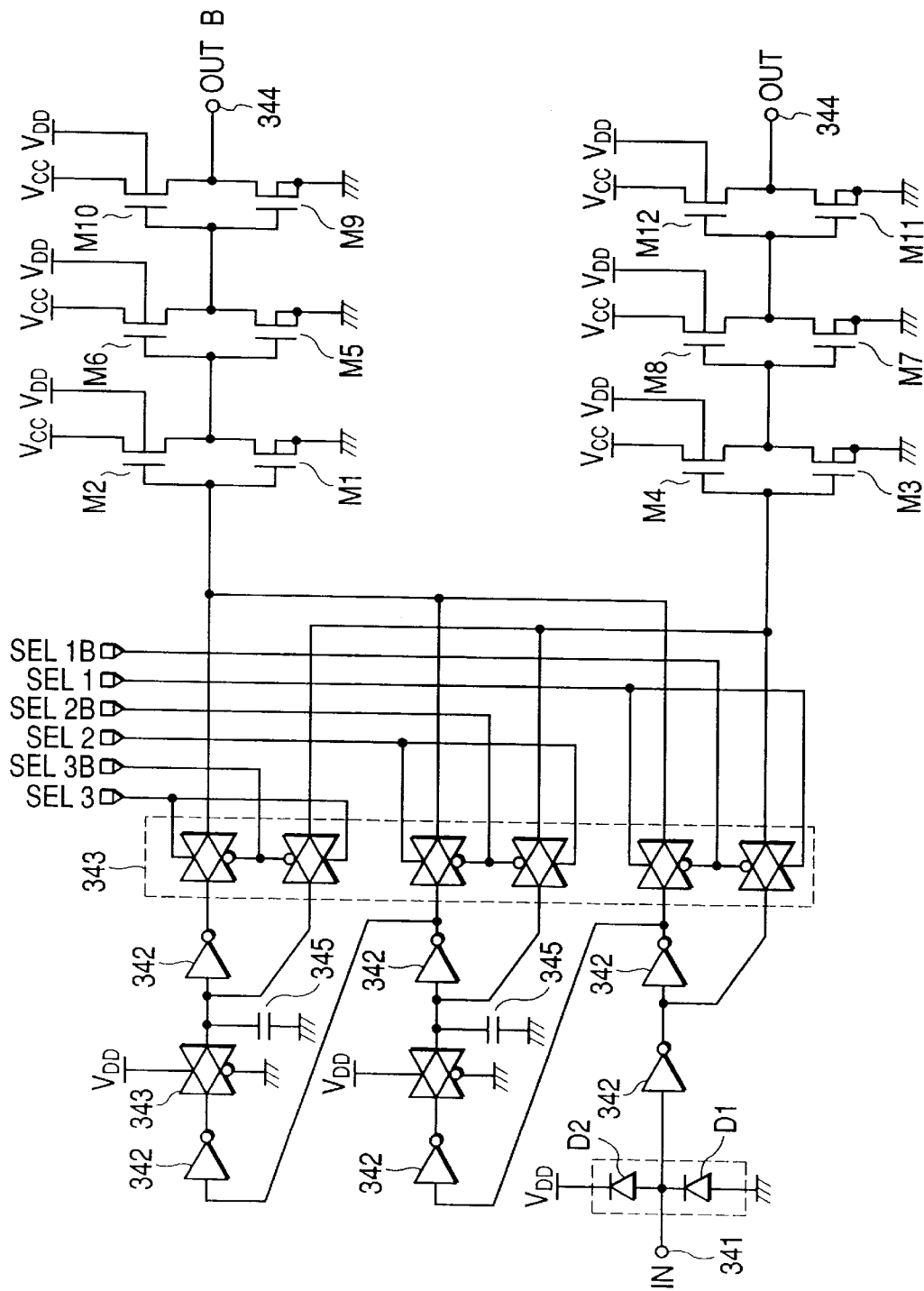
FIG. 27 is a circuit diagram including a delay circuit in an input section of the liquid crystal apparatus according to this invention.

Next, a method for accurately synchronizing with a sampling pulse is explained with reference to FIG. 27. To implement this method, the amount of delay for a sampling pulse must be varied. Reference numeral 342 denotes a pulse delay inverter, 343 is a switch for determining which delay inverter to select, 344 is an output for which the amount of delay is controlled, and 345 is a capacity (out B is an opposite-phase output, and out is an in-phase output). Reference numeral 346 denotes a protective circuit.

A combination of SEL1 (SEL1B) to SEL3 (SEL3B) can select the number of delay inverters 342 to pass through.

Due to the integration of this synchronization circuit into the panel, when three panels for R, G, and B are used and if the amount of delay for pulses from the exterior of the panel becomes asymmetrical due to jigs being used, it can be adjusted using the above selection switch to obtain an excellent display image without an offset caused by a high RGB pulse phase region. In addition, it is of course effective to build a temperature-measuring diode into the panel and to correct the amount of delay referenced from a table based on a temperature output from the diode.

Next, the relationship with the material of the liquid crystal is described. Although FIG. 24 shows the flat opposed-substrate structure, concaves and convexes are formed on a surface of the common electrode substrate 316 to prevent the interfacial reflection from the common transparent electrode 315, which is provided on this surface. In addition, the reflection prevention film 320 is provided opposite to the common electrode substrate 316. Due to these concaves and convexes, the use of plate grinding polishing using abrasive grains of a very small grain size is also effective on the improvement of contrast.

The liquid crystal material is a polymer network liquid crystal PNLC. PDLC, however, may be used as the polymer network liquid crystal. The polymer network liquid crystal PNLC is produced by the polymerization phase separation process. A solution is produced using a liquid crystal and a polymerized monomer or oligomer and is injected into a cell in a normal manner. UV polymerization is used to phase-separate the liquid crystal and the polymer, so that the polymer is formed like a mesh in the liquid crystal. PNLC contains a large amount of liquid crystal (70 to 90 wt %).

In PNLC, a nematic liquid crystal of a high reflection anisotropy ($\Delta n$) can be used to reduce light scattering, whereas a nematic liquid crystal of a high dielectric anisotropy ($\Delta \epsilon$) can be used to enable driving at a low voltage. If the size of the polymer network, that is, the center distance of the mesh is between 1 and 1.5 ($\mu$m), light scattering is intense enough to obtain a high contrast.

Next, the relationship between the seal structure and the panel structure is explained with reference to FIG. 28. In this figure, 351 is a seal section, 352 is an electrode pad, and 353 is a clock buffer circuit. An amplifier section (not shown) is used as an output amplifier during the electric inspection of the panel. In addition, there is an Ag paste section (not shown) for setting the potential of the opposite substrate, and 356 is a display section comprising liquid crystal elements and 357 is a peripheral-circuit section including horizontal and vertical shift registers (SR). The seal section 351 is formed to surround the display section 356 and constitutes a contact region for a pressure contact agent or an adhesive used to stick together the semiconductor substrate 301 including the pixel electrodes 312 thereon and a glass substrate including the common electrodes 315 thereon. After these substrates are stuck together using the seal section 351, the liquid crystal is filled in the display section 356 and the shift register section 357.

Figure 28:
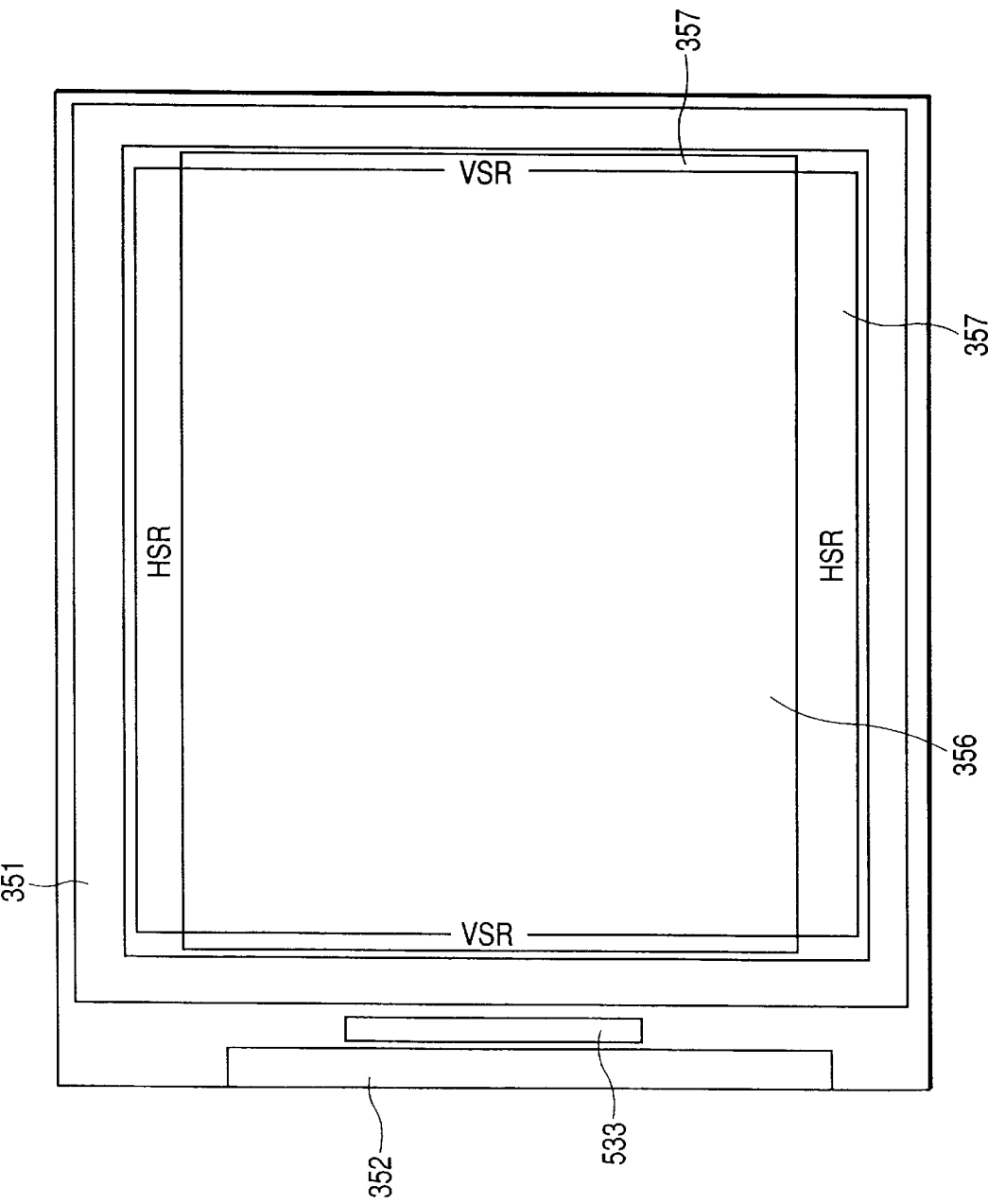
FIG. 28 is a conceptual drawing of a liquid crystal panel in the liquid crystal apparatus according to this invention.

As shown in FIG. 28, the circuits are provided both inside and outside the seal to reduce the total chip size, according to this embodiment. Although this embodiment provides an outlet for pads only on one side of the panel, it may be formed on two longer sides or more sides and this is effective in dealing with fast clocks.

Furthermore, the panel according to this invention uses the semiconductor substrate such as an Si substrate, so if the panel is irradiated with a very intense light as in a projector and the light impinges on the side wall of the substrate, the potential of the substrate may vary to cause the panel to malfunction. Thus, the side wall of the panel and the peripheral-circuit portion in the display region on the top surface of the panel comprise a substrate holder that can be shaded. In addition, the rear surface of the Si substrate has a holder structure in which metal such as Cu having a high thermal conductivity is connected to the surface via an adhesive also having a high thermal conductivity.

Figure 29:
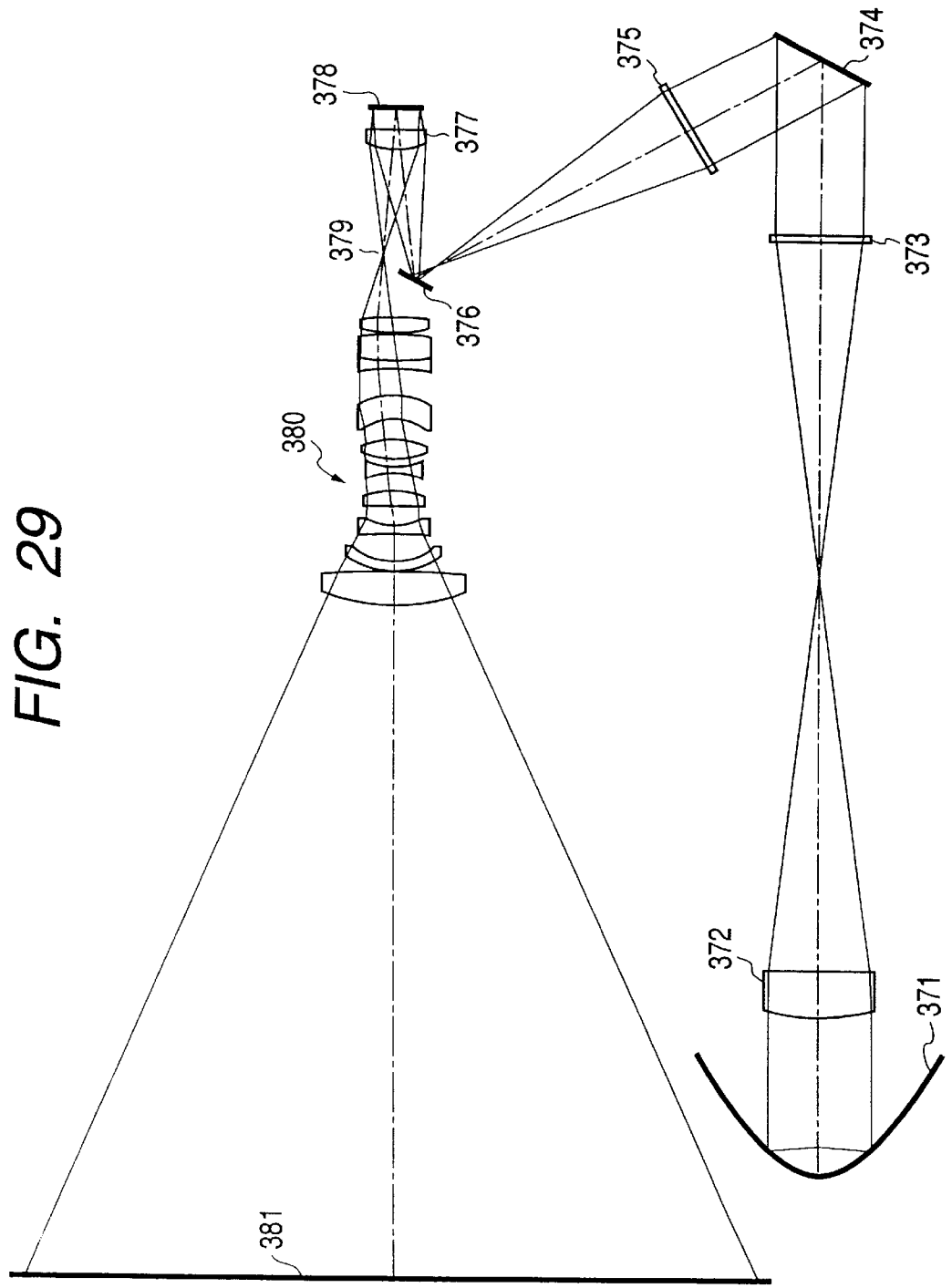
FIG. 29 is a conceptual drawing of a liquid crystal projector using the liquid crystal apparatus according to this invention.

Next, an optical system integrated into which the reflecting liquid crystal panel according to this invention is described with reference to FIG. 29. In FIG. 29, 371 is a light source such as a halogen lamp, 372 is a converging lens for converging an image from the light source, 373 and 375 are plane-shaped convex Fresnel lenses, and 374 is a color separating optical element that separates light into R, G, and B and for which a dichroic mirror or a diffraction grating can be effectively used.

In addition, 376 is a mirror that guides R, G, and B beams obtained by separating the incident beams, to the R, G, and B panels, respectively, 377 is a field lens for changing converging beams into parallel ones to illuminate the reflecting liquid crystal panel, and 378 is the reflecting liquid crystal element described above, and there is a diaphragm at 379. In addition, 380 is a projection lens comprising multiple lenses for enlargement, and 381 is a screen that is normally composed of a Fresnel lens that converts projection beams into parallel ones and a lenticular lens that displays an image at vertically and laterally wide angles of visibility to provide bright images with a high contrast.

Although the configuration in FIG. 29 shows only one color panel, the incident beams are separated into three colors between the color-separating optical element 374 and the diaphragm 379, so three panels are actually installed. This system, however, can be configured with a single plate instead of the three plates by providing a micro lens array on the surface of the panel of the reflecting liquid crystal apparatus and irradiating different pixel regions with different incident beams. A voltage is applied to a liquid crystal layer of liquid crystal elements and light reflected from each pixel penetrates the diaphragm shown at 379 and is projected onto the screen.

On the other hand, when no voltage is applied to allow the liquid crystal layer to remain a scattering body, light incident on the reflecting liquid crystal elements is scattered and scattered beams other than those directed within the angle of the aperture of the diaphragm shown at 379 do not enter the projection lens. These beams are represented as black. As is apparent from the above description, this optical system does not require the deflecting plate and signal beams enter the projection lens at a high reflectance. As a result, all the surfaces of the pixel electrodes serve to provide a display twice or three times brighter than the conventional one. As described in the above embodiments, the surface of the opposite substrate and the interface are prevented from reflection to provide very few noise beam components, thereby realizing a high-contrast display. In addition, the size of the panel can be reduced to miniaturize all optical elements (the lenses and mirrors, etc.), thereby reducing the costs and weight of the apparatus.

With respect to the non-uniform colors, non-uniform brightness, and variation of the light source, an integrator (a fly-eye-lens-type rod) can be inserted between the light source and the optical system to avoid the non-uniform colors and brightness on the screen.

A peripheral electric circuit separate from the liquid crystal panel is described with reference to FIG. 30. In this figure, 385 is a power source that is roughly divided into a lamp power source and a system power source for driving the panel and signal processing circuit. Reference numeral 386 denotes a plug, and 387 is a temperature detector that is operative if the temperature of the lamp becomes abnormal to provide control, for example, stops the lamp using a control board 388. In this case, in addition to the lamp, a filter safety switch, which is shown at 389, is controlled. For example, safety is maintained by preventing a high-temperature lamp house box from being opened if anyone attempts to open it. Reference numeral 390 designates a speaker and 391 is a sound board into which a processor for 3D or surround sounds can be built as required. Reference numeral 392 denotes an extension board 1 consisting of an S terminal for video signals, an input terminal to which composite images and sounds for video signals are input from an external apparatus 396, a selection switch 395 for selecting a signal, and a tuner 394. The extension board 1 sends signals to an extension board 2 via a decoder 393. The extension board 2 has a Dsub 15-pin terminal for another video or a computer and uses an A/D converter 451 to convert video signals from the decoder 393 into digital signals via a switch 450.

In addition, 453 is a main board mainly consisting of a memory such as a video RAM and a CPU. An NTSC signal that has been subjected to A/D conversion by the A/D converter 451 is stored in the memory. To appropriately assign this signal to a large number of pixels, a signal for idle elements required to cover the total number of liquid crystal elements is created through interpolation or the NTSC signal is subjected to processing such as γ conversion edge gradation, brightness adjustments, or bias adjustments. In addition to the NTSC signal, a computer signal, for example, a VGA signal is subjected to resolution conversion processing if a high-resolution XGA panel is used. In addition to the NTSC signal for single image data, an NTSC signal for multiple image data and a computer signal are synthesized by the main board 453. The output from the main board 453 is serial-parallel-converted so as not to be affected by noise before being output to a head board 454. The head board 454 then parallel-serial converts the signal, D/A converts it, divides it depending on the number of video lines in the panel, and writes it to a B, a G, and an R liquid crystal panels 455, 456, and 457 via a drive amplifier. Reference numeral 452 is a remote-control panel that allows the computer screen to be simply operated as in televisions. The liquid crystal panels 455, 456, and 457 have the same liquid crystal apparatus configuration with color filters for the respective colors and include the horizontal and vertical scanning circuit described in the preceding embodiment. As described above, according to this invention, each liquid crystal apparatus processes the grade of images that do not necessarily have a high resolution so as to increase their grade, thereby enabling very clear images to be displayed.

The display apparatus shown in this example can be configured using the approaches shown in the third to fifth embodiments.

What is claimed is:

1. A process for forming an interlayer insulating film using an SOG film, said process comprising the steps of:
    forming a first inorganic SOG film having a thickness in the range between 50 nm and 400 nm, on a substrate;
    irradiating the first inorganic SOG film with ultraviolet light in an atmosphere containing oxygen components to generate ozone and active oxygen atoms in order to irradiate the SOG film with the atoms; and
    further forming a second inorganic SOG film, having a thickness in the range between 50 nm and 400 nm, thereon.

2. A process for forming an interlayer insulating film according to claim 1, wherein the inorganic SOG film is formed between a first and a second interlayer insulating films.

3. A process for forming an interlayer insulating film according to claim 1 or 2, wherein said inorganic SOG film does not contain phosphorous (P).

4. In a process for forming an interlayer insulating film using an SOG film according to claim 1, a process for manufacturing the interlayer insulating film comprising the steps of:

emitting ultraviolet light in an atmosphere containing oxygen components to generate ozone and active oxygen atoms in order to perform said step of irradiating the first inorganic SOG film with the atoms; and further forming the second inorganic SOG film thereon to reduce or eliminate steps or voids on an element separation and an element formation regions.

5. In a process for forming an interlayer insulating film using an SOG film according to claim 1, a process for manufacturing the interlayer insulating film comprising the steps of:

emitting ultraviolet light in an atmosphere containing oxygen components to generate ozone and active oxygen atoms in order to perform said step of irradiating the first inorganic SOG film with the atoms, thereby cutting hydrogen radicals off from the top surface layer of the first inorganic SOG film; and further forming the second inorganic SOG film thereon.

6. A process for forming an interlayer insulating film according to claim 1, wherein the wavelength of said ultraviolet light is between 100 and 300 nm.

7. A process for forming an interlayer insulating film using an SOG film, said process comprising the steps of:

forming a first inorganic SOG film having a thickness in the range between 50 nm and 400 nm, on a substrate;

irradiating the first inorganic SOG film with $O_2$ plasma; and further forming a second inorganic SOG film having a thickness in the range between 50 nm and 400 nm, thereon.

8. A process for forming an interlayer insulating film using an SOG film, said process comprising the steps of:

forming a first inorganic SOG film having a thickness in the range between 50 nm and 400 nm, on a substrate;

irradiating the first inorganic SOG film with $O_2$ plasma; and further forming a second inorganic SOG film having a thickness in the range between 50 nm and 400 nm, thereon to reduce or eliminate steps or voids on an element separation and an element formation regions.

9. A process for forming an interlayer insulating film according to claim 7 or 8, wherein the first inorganic SOG film is irradiated with $O_2$ plasma to cut hydrogen radicals off from the top surface layer of the first inorganic SOG film.

10. A process for forming an interlayer insulating film according to claim 1, wherein an interval of metal wirings covered with the interlayer insulating film is between 0.3 and 4.0 μm and wherein an amount of concavity in the insulating film on an element separation region is 1.5 μm or less.

11. A process for manufacturing an interlayer insulating film according to claim 1, wherein said step for forming the inorganic SOG film is repeated to form three or more layers of inorganic SOG films.

12. A method for manufacturing a display apparatus including a semiconductor device having an interlayer insulating film, wherein: said interlayer insulating film is formed by the process for forming an interlayer insulating film according to claim 1.

13. A process for forming an interlayer insulating film for a semiconductor device, said process comprising repeating a step of forming an insulating film on a metal wiring and a step of forming an inorganic SOG film having a thickness in the range between 50 nm and 400 nm, thereon to form an interlayer insulating film consisting of a multilayer structure including the insulating films and inorganic SOG films.

14. A process according to claim 13, wherein the step of forming said inorganic SOG film has the steps of forming the inorganic SOG film, irradiating the inorganic SOG film with a UV light or $O_2$ plasma, and forming the inorganic SOG film again.

15. A process for forming an interlayer insulating film for a semiconductor device, said process comprising forming a first insulating film on a metal wiring, forming a first inorganic SOG film having a thickness in the range between 50 nm and 400 nm, thereon, further forming a second insulating film thereon, forming a second inorganic SOG film having a thickness in the range between 50 nm and 400 nm, thereon, and further forming a third insulating film thereon to form the interlayer insulating film.

16. A process for forming an interlayer insulating film for a semiconductor device, said process comprising forming a first insulating film on a metal wiring, forming a first inorganic SOG film having a thickness in the range between 50 nm and 400 nm, thereon, irradiating the first SOG film with a UV light, further forming a second inorganic SOG film having a thickness in the range between 50 nm and 400 nm, thereon, forming a second insulating film thereon, further forming a third inorganic SOG film having a thickness in the range between 50 nm and 400 nm, and forming a third insulating film thereon to form the interlayer insulating film.

17. A process for forming an interlayer insulating film for a semiconductor device, said process comprising forming a first insulating film on a metal wiring, further forming a first inorganic SOG film having a thickness in the range between 50 nm and 400 nm, thereon, irradiating the film with SOG film with $O_2$ plasma, forming a second inorganic SOG film having a thickness in the range between 50 nm and 400 nm, thereon again, forming a second insulating film thereon, further forming a third inorganic SOG film having a thickness in the range between 50 nm and 400 nm, and further forming a third insulating film thereon to form the interlayer insulating film.

18. A process for forming a semiconductor device according to any of claims 13 to 17, wherein a film stress of the insulating film over and/or under the inorganic SOG film acts in a direction opposite to that in the inorganic SOG film.

19. A process for forming a semiconductor device according to claim 14 or 16, wherein the UV light is provided in an atmosphere containing $O_2$ components and wherein its wavelength is either 172 or 185 or 254 nm.

20. A process for forming a semiconductor device according to claim 13, wherein the process has the steps of forming a contact opening and forming a wiring section, and wherein:

the diameter of the contact opening is between 0.6 and 1.2 μm and a wiring interval is between 0.5 and 1.5 μm.

* * * * *

UNITED STATES PATENT AND TRADEMARK OFFICE
CERTIFICATE OF CORRECTION

PATENT NO. : 6,274,516 B1
DATED : August 14, 2001
INVENTOR(S) : Seiji Kamei et al.

Figure 30:
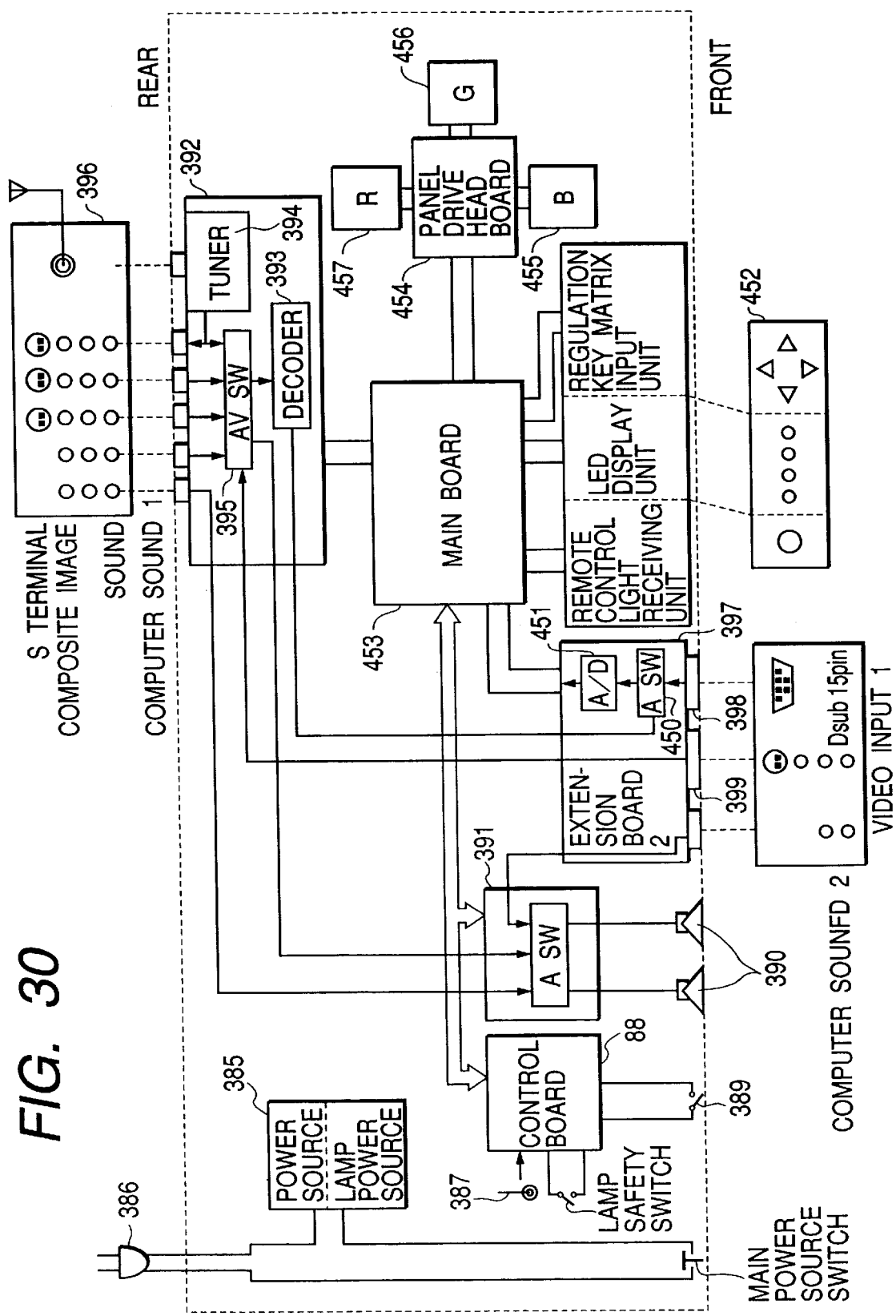
FIG. 30 is a circuit block diagram showing the inside of the liquid crystal projector according to this invention.

It is certified that error appears in the above-identified patent and that said Letters Patent is hereby corrected as shown below:

Sheet 27 of 27,
Figure 30, "SOUNFD" should read -- SOUND --.

Column 3,
Line 24, "needs" should read -- need --.

Column 5,
Line 33, "characteristics diagram" should read -- characteristic diagrams --.

Column 7,
Line 13, "needs" should read -- need --.

Column 11,
Line 51, "regions" should read -- region --.

Column 12,
Line 53, "4,000 Å" should read -- 4,000 Å. --.

Column 14,
Line 38, "regions" should read -- region --.

Column 17,
Line 29, "regions" should read -- region --.

Column 31,
Line 29, "enable" should read -- enabling --.

Signed and Sealed this

Twenty-sixth Day of February, 2002

Attest:

JAMES E. ROGAN
*Attesting Officer*     *Director of the United States Patent and Trademark Office*